(12) United States Patent
Bhaskaran et al.

(10) Patent No.: US 11,740,493 B2
(45) Date of Patent: Aug. 29, 2023

(54) TRANSFLECTIVE, PCM-BASED DISPLAY DEVICE

(71) Applicant: E INK CORPORATION, Billerica, MA (US)

(72) Inventors: Harish Bhaskaran, Oxford (GB); Peiman Hosseini, Bichester (GB); Ben Broughton, Marston (GB)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 17/987,554

(22) Filed: Nov. 15, 2022

(65) Prior Publication Data

US 2023/0070453 A1 Mar. 9, 2023

Related U.S. Application Data

(63) Continuation of application No. 16/468,829, filed as application No. PCT/EP2017/078243 on Nov. 3, 2017, now Pat. No. 11,520,172.

(30) Foreign Application Priority Data

Dec. 12, 2016 (EP) .................................. 16203522

(51) Int. Cl.
| | |
|---|---|
| *G02F 1/01* | (2006.01) |
| *F21V 8/00* | (2006.01) |
| *H01L 23/34* | (2006.01) |
| *H10N 70/20* | (2023.01) |
| *H10N 70/00* | (2023.01) |

(52) U.S. Cl.
CPC ......... *G02F 1/0147* (2013.01); *G02B 6/0001* (2013.01); *G02B 6/0033* (2013.01);
(Continued)

(58) Field of Classification Search
None
See application file for complete search history.

(56) References Cited

U.S. PATENT DOCUMENTS

| | | |
|---|---|---|
| 6,750,996 B2 | 6/2004 | Jagt et al. |
| 9,823,538 B2 | 11/2017 | Bhaskaran et al. |
| | (Continued) | |

FOREIGN PATENT DOCUMENTS

| | | | |
|---|---|---|---|
| CN | 104730796 A | | 6/2015 |
| CN | 105938261 | * | 9/2016 |
| | (Continued) | | |

OTHER PUBLICATIONS

Pernice, Wolfram H. P. et al., "Photonic non-volatile memories using phase change materials", Applied Physics Letters, vol. 101, No. 171101 (2012).

(Continued)

*Primary Examiner* — Ashok Patel
(74) *Attorney, Agent, or Firm* — Brian D. Bean

(57) ABSTRACT

The invention is notably directed to a transflective display device. The device comprises a set of pixels, wherein each of the pixels comprises a portion of bi-stable, phase change material, hereafter a PCM portion, having at least two reversibly switchable states, in which it has two different values of refractive index and/or optical absorption. The device further comprises one or more spacers, optically transmissive, and extending under PCM portions of the set of pixels. One or more reflectors extend under the one or more spacers. An energization structure is in thermal or electrical communication with the PCM portions, via the one or more spacers. Moreover, a display controller is configured to selectively energize, via the energization structure, PCM portions of the pixels, so as to reversibly switch a state of a PCM portion of any of the pixels from one of its reversibly switchable states to the other. A backlight unit is furthermore configured, in the device, to allow illumination of the PCM portions through the one or more spacers. The backlight unit is controlled by a backlight unit controller, (Continued)

which is configured for modulating one or more physical properties of light emitted from the backlight unit. The invention is further directed to related devices and methods of operation.

19 Claims, 7 Drawing Sheets

(52) U.S. Cl.
CPC ......... *G02B 6/0055* (2013.01); *G02B 6/0075* (2013.01); *G02F 1/01* (2013.01); *G02F 1/0102* (2013.01); *G02F 1/0105* (2013.01); *G02F 1/0107* (2013.01); *G02F 1/0121* (2013.01); *H01L 23/345* (2013.01); *H10N 70/20* (2023.02); *H10N 70/231* (2023.02); *H10N 70/8613* (2023.02); *G02F 2203/09* (2013.01); *G02F 2203/12* (2013.01); *G02F 2203/50* (2013.01)

(56) References Cited

U.S. PATENT DOCUMENTS

| | | | |
|---|---|---|---|
| 10,720,608 | B2 | 7/2020 | Ko et al. |
| 10,884,314 | B2 | 1/2021 | Broughton et al. |
| 11,215,852 | B2 | 1/2022 | Hosseini et al. |
| 2003/0067760 | A1* | 4/2003 | Jagt ...................... G03H 1/0248 362/606 |
| 2006/0119774 | A1 | 6/2006 | Chen |
| 2019/0198820 | A1* | 6/2019 | Ko ........................ G02F 1/0105 |

FOREIGN PATENT DOCUMENTS

| | | | |
|---|---|---|---|
| JP | 2009086060 A | | 4/2009 |
| WO | 2015097468 | * | 7/2015 |
| WO | 2016125491 | * | 8/2016 |
| WO | 2017215363 A1 | | 12/2017 |

OTHER PUBLICATIONS

European Patent Office, "Extended European Search Report", EP Appl. No. 16203522.4, dated Apr. 21, 2017.
European Patent Office, "International Search Report & Written Opinion", PCT/EP2017/078243, dated Jan. 16, 2018.
Kim, Young Chul et al., "Optimized Pattern Design of Light-Guide Plate (LGP)," Optica Applicata, vol. 41, (2011).
Pan, Jui-Wen et al., "Light-guide plate using perioical and single-sized microstructures to create a uniform backlight system", Optics Letters, vol. 37, Issue 17, pp. 3726-3728 (2012).

* cited by examiner

TRANSFLECTIVE, PCM-BASED DISPLAY DEVICE

RELATED APPLICATIONS

This application is a continuation of U.S. Ser. No. 16/468,829, which is the U.S. national phase application of International Application No. PCT/EP2017/078243 filed Nov. 3, 2017 which designated the U.S. and claims priority to European Patent Application No. 16203522.4 filed Dec. 12, 2016. The contents of all patents and publications disclosed herein are incorporated by reference in their entireties.

FIELD OF THE INVENTION

The invention relates in general to the field of display devices based on phase change materials (PCMs) and related methods of operation. In particular, it is directed to a transflective display.

BACKGROUND

There has been considerable research into PCM technology and its use in optoelectronic devices such as ultra-high resolution reflective displays, see-through displays, and force sensors. PCMs include materials that can be electrically switched between two or more phases that have different optoelectronic properties. Bi-stable PCMs are particularly attractive because after a phase transition has been completed it is not necessary to continuously apply power to maintain the device in the new state. In this way displays can be manufactured with low power consumption. In order to further minimise power consumption, reflective PCM displays have been proposed. In a reflective display, a mirror placed below the PCM element reflects back the ambient light incident on the display, which effectively passes through the device twice, it being understood that ambient light can be naturally generated or not. This, in principle, eliminates the need for a backlight and further substantially reduces the power consumption of the display. Furthermore, in bright sunlight the display is fully visible, unlike displays with a backlight which tend to be partially or fully obscured by high ambient light levels. However, a disadvantage of the reflective displays is that they can typically not be viewed in low ambient light or darkness as they do not generate light of their own.

On the other hand, transflective liquid-crystal displays are known, which combine advantages of reflective displays with some form of backlighting, thus allowing them to be used in low light conditions. For example, US2003067760 (A1) describes a waveguide that can be used in an edge-lit arrangement, which has a high brightness and makes efficient use of light coupled thereto, for use in liquid-crystal displays.

SUMMARY

According to a first aspect, the present invention is embodied as a transflective display device. The device comprises a set of pixels, wherein each of the pixels comprises a portion of bi-stable, phase change material (hereafter a PCM portion), having at least two reversibly switchable states, in which it has two different values of refractive index and/or optical absorption. The device further comprises one or more spacers, optically transmissive, and extending under PCM portions of the set of pixels. One or more reflectors extend under the one or more spacers. An energization structure is in thermal or electrical communication with the PCM portions, via the one or more spacers. Moreover, a display controller is configured to selectively energize, via the energization structure, PCM portions of the pixels, so as to reversibly switch a state of a PCM portion of any of the pixels from one of its reversibly switchable states to the other. In addition, a backlight unit is configured, in the device, to allow illumination of the PCM portions through the one or more spacers. The backlight unit is controlled by a backlight unit controller, which is configured for modulating one or more physical properties of light emitted from the backlight unit.

The present approach exploits spacers present in known, reflective PCM displays to achieve a transflective PCM displays, which combines advantages of PCM-based displays and transflective displays. I.e., the present devices can be used in low light conditions (with backlighting), while allowing low power operation under ambient lighting.

In preferred embodiments, the energization structure is a heating structure that is electrically insulated from the PCM portions but in thermal communication therewith, via the spacers. The heating structure preferably extends under the one or more reflectors or laterally thereto, or are integral therewith. The spacers are thermally conducting and the display controller is configured to energize the heating structure to thereby selectively heat PCM portions of the pixels, so as to reversibly switch a state of a PCM portion of any of the pixels from one of its reversibly switchable states to the other.

Relying on thermal activation of the PCM pixels allows larger regions of the PCM portions to be switched, which, in turn, improves optical properties of the devices, compared to devices where PCM pixels are electrically switched, e.g., by applying a voltage, which typically results in filamentary switching a (smaller) region of the PCM. Thermal switching is enabled through the spacers, which need be thermally conducting. The spacers have a further advantage that they contribute to diffuse heat from the heater elements of the heating structure, which eventually allows a more uniform switching of the PCM and, therefore, larger regions of the PCM portions to be switched, which eventually improves optical properties of the devices.

Advantageously, said one or more reflectors may be provided as a reflective layer extending under the set of pixels. E.g., a same reflective layer 15 may be used for all pixels or a subset thereof, to simplify the fabrication process.

In a first class of embodiments, the backlight unit is a direct backlight unit, arranged in the device to illuminate the PCM portions from a backside of the device. The direct backlight unit is located opposite to the PCM portions with respect to an average plane of said one or more reflectors. The latter need, in that case, be partially reflective (and thus partially transparent). Such embodiments are perhaps the easiest to fabricate, as no additional components (e.g., waveguide, cladding layer, or optical structures) to optically guide or redirect light toward the PCM pixels are needed.

In variants (second class of embodiments), the backlight unit is an edge backlight unit, arranged in the device to illuminate the PCM portions from a lateral side of the device, via one or more waveguides. Here the waveguides extend, each, in a same plane that is parallel to an average plane of the one or more reflectors. In such variants, a fully reflective mirror can be used (with reflectance close to 100% in the visible spectral range) as the edge backlight does not require the reflector to be partially transparent.

The above waveguides may for instance be arranged on top of the PCM portions, opposite to the one or more reflectors, with respect to the PCM portions.

Preferably, the spacers may further be leveraged to act as waveguides. Each of the spacers may, in that case, be cladded with cladding layers, so as to foam the waveguides, for the backlight unit to illuminate the PCM portions via the spacers. In addition, one or each of the cladding layers can be patterned with microstructures, or otherwise comprise optical structures, designed and arranged with respect to the pixels so as to allow light emitted from the backlight unit and internally reflected in the spacers (i.e., propagated therein) to exit towards PCM portions of each of the pixels.

In embodiments, the waveguides are distinct from the spacer and arranged below the PCM pixels, so as not to impact light reflected from the reflector toward the PCM pixels. That is, the reflectors comprise a reflective layer that extends under the one or more spacers and the one or more waveguides are configured as a waveguide extending below said reflective layer, opposite to the one or more spacers with respect to said reflective layer. In such a case, the device need be provided with optical structures, arranged in or on the reflective layer, or in a vicinity thereof, the optical structures designed and arranged with respect to the pixels so as to allow light emitted from the backlight unit and internally reflected in the waveguide to exit toward a PCM portion of each of the pixels.

Preferably, such optical structures comprise one or more of: lensed structures, in contact with said reflective layer (e.g., at an interface therewith); holes provided in said reflective layer; microstructures on said reflective layer or in a layer in contact with said reflective layer; and scattering features.

In embodiments, the device comprises a narrow-band pass filter, the latter including a stack of layers, wherein one or more of the layers of the stack act as said reflective layer, the stack of layers being otherwise designed so as to filter a spectral range of light that exit toward the PCM portions from said waveguide, in operation. The narrowband filter conditions the spectral range of the backlight from the waveguide which passes through the PCM stack, affording more precise control of the spectral characteristics of each pixel.

Preferably, the device further comprises a wavelength shifter on top of the reflective layer, opposite to the waveguide with respect to the reflective layer, such that UV illumination from sunlight can be converted to visible light to increase the brightness of the display.

In preferred embodiments, each of the pixels has a layer structure that includes a distinct, bi-stable PCM layer portion, the latter including a PCM portion having at least two reversibly switchable states. Having distinct PCM layer portion per pixel mitigates the risk of inadvertent switching of neighbouring PCM portions.

Preferably then, the layer structure of each of the pixels includes a capping layer above a PCM portion thereof, opposite to the one or more spacers with respect to said PCM portion, the capping layer preferably comprising a same material as said one or more spacers.

In embodiments, the capping layer comprises reflective optical structures, such as flat mirrors or lenses, configured to reflect light, which initially was emitted from the backlight unit and then out-coupled toward the pixels, toward said one or more reflectors. As it may be realized, using upper reflective optical structures allows greater flexibility in the design of the display devices.

According to another aspect, the invention can be embodied as a method for operating a transflective display device such as described above. Basically, this method involves two mechanisms, which are typically concurrently implemented. On the one hand, the PCM pixels are selectively energized, via the display controller, so as to reversibly switch a state of a PCM portion thereof from one of its reversibly switchable states to the other. On the other hand, one or more physical properties of light emitted by the backlight unit are modulated via the backlight unit controller, e.g., as needed to reach optimal optical properties.

In preferred embodiments of the method, the latter further comprises monitoring an external illuminance with an illuminance sensor, and the physical properties of light emitted by the backlight unit are modulated based on the monitored external illuminance.

Devices and methods embodying the present invention will now be described, by way of non-limiting examples, and in reference to the accompanying drawings.

BRIEF DESCRIPTION OF SEVERAL VIEWS OF THE DRAWINGS

FIGS. 1-9 show 2D cross-sectional views of components of PCM-based display devices according to embodiments. In detail:

FIGS. 1, 2 and 8 show 2D cross-sectional views of a PCM pixel as involved in display devices according to a first class of embodiments;

FIG. 1 shows a PCM pixel coupled to a display controller and a direct backlight unit, according to embodiments;

FIG. 8 depicts a PCM pixel wherein a spacer of the pixel structure acts as a waveguide to propagate backlight, which spacer further include reflecting structures, as in embodiments, FIGS. 3-9 depicts a PCM pixel coupled to an edge backlight unit, according to a second class embodiments. Namely:

FIGS. 4-7 show PCM pixels wherein a distinct waveguide is used to propagate light emitted from the edge backlight unit, as involved in other embodiments (FIGS. 6B and 7B illustrate reflectances as typically obtained with devices as in FIGS. 6A and 7A, respectively); and FIG. 9 shows a PCM pixel wherein an additional waveguide is provided on top to propagate the backlight, as in embodiments.

Figure 1:
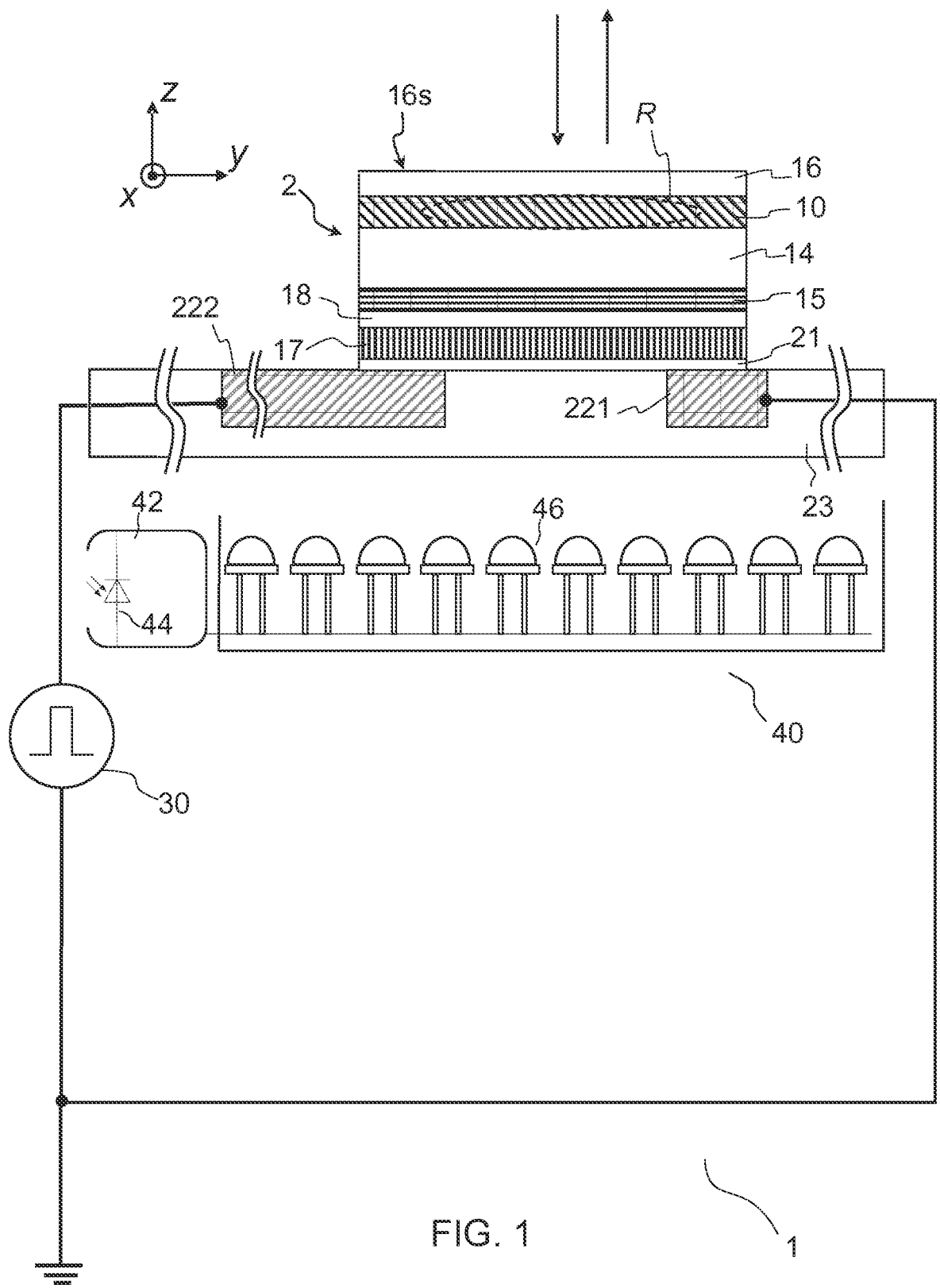

The accompanying drawings show simplified representations of devices (or parts thereof), as involved in embodiments, or operation thereof. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The following description is structured as follows. First, general embodiments and high-level variants are described (sect. 1). The next section describes embodiments as depicted in FIGS. 1-9. The last section addresses more specific embodiments and technical implementation details (sect. 3).

General Embodiments and High-Level Variants

In reference to FIGS. 1-11, an aspect of the invention is first described, which concerns a transflective display device 1, 1 a-1 h (hereafter referred to as a "display", for short).

The display notably comprises a set of pixels 2, 2 a-2 h. Each of the pixels 2, 2 a-2 h comprises a portion of bi-stable, phase change material (PCM) 10, hereafter referred to as a PCM portion. A PCM portion means a layer portion of phase change material 10, which contains a region R that can potentially be switched upon energization. The PCM portion has at least two reversibly switchable states, in which it has two different values of refractive index and/or optical absorption. The PCM layer comprises a hi-stable material, so that no energy need be continuously applied after switching.

The display further comprises one or more spacers 14, which are optically transmissive and extend under PCM portions 10 of the set of pixels 2, 2 a-2 h. Interestingly, the thickness of the spacers 14 may be varied from one pixel to the other, so as to exploit interference effects, as explained later in detail.

"Optically transmissive" as used herein generally means permissive to light in the optical range (100 nm-1 mm, according to DIN 5031), and preferably as transparent as possible in this range. "Extend under" means that, in a given reference frame where the pixels protrudes on top so as to have a viewing surface on top (as assumed in FIGS. 1-9), the spacers are located under the PCM portions. The spacers may for instance extend directly under the PCM portions (the PCM layer coats the spacer layer(s)), unless another intermediate layer is needed, e.g., to achieve electrical insulation, if needed.

One or more reflectors (i.e., mirrors) 15 are further provided in the device, which extend under the one or more spacers 14 in that same reference frame. The reflectors may for instance extend directly under the spacers (the spacer layer(s) coats the reflector layer(s)), unless another, intermediate layer is needed. The reflector (i.e., a mirror formed by a reflective layer) may extend under one or more (or possibly the whole set) of PCM pixels, in specific embodiments as discussed below.

In some of the embodiments described herein, the PCM layer 10 too may extend across several pixels. Thus, PCM pixels may use distinct PCM layer portions or exploit a same PCM layer, in which distinct regions R can be switched, at the level of each of the pixels. In the latter case, additional optical structures are needed, as discussed later. In all cases, each pixel involves distinct, switchable regions R of the PCM layer (or layer portions), by virtue of the relative locality of the switching phenomenon (only a relatively small, local region of a PCM layer may for instance be switched). Thus, irrespective whether a wide PCM layer or a PCM layer portion is involved, a portion of the PCM can in all cases be selectively switched, at the level of each pixel, so as for each PCM pixel to exhibit at least two reversibly switchable states of refractive index and/or optical absorption.

An additional capping layer 16 is typically provided on top of the pixels, which may for instance be of the same material as the lower spacers 14. The skilled person will appreciate that most material layers (e.g., layers 10, 14, 15, 16) as evoked herein may in fact decompose into a stack of sublayers, if necessary structured, to achieve or improve a desired function.

Furthermore, an energization structure 17, 21, 221, 222 is involved to switch the PCM portions. To that aim, the energization structure is either in thermal communication or in electrical communication with the PCM portions 10, via the one or more spacers. In other words, the energization structure can either rely on a mere electrical actuation, using electrodes and electrically conductive materials, or on thermal activation, using electrodes, thermally conducting materials but not electrically conductive materials to avoid electrical shorts, as discussed later in detail. Preferred is to rely on thermal activation, as this allows larger regions of the PCM portions to be switched.

The display further includes a display controller 30 (hereafter a "controller"), which is configured to selectively energize PCM portions of the pixels via the energization structure 17, 21, 221, 222, so as to reversibly switch a state of a PCM portion of any of the pixels 2, 2 a-2 h from one of its reversibly switchable states to the other. The energization scheme is selective, so as to selectively switch PCM portions of the pixels, according to images or other pictograms to be displayed. As usual in display applications, the activated pixels may be refreshed at a given refreshing frequency (i.e., switched back to a first state and again to a second state according to said frequency).

The display controller will typically be implemented as an integrated circuit IC, the latter possibly involving different IC elements) that produces signals (e.g., video signals) for the display system, e.g., generates timing of the signals and blanking interval signal.

The device further comprises a backlight unit 40, configured in the device to allow illumination of the PCM portions through the one or more spacers 14. The backlight unit may be arranged in the device so as to allow direct or edge (lateral) backlight. The backlight unit typically uses LEDs 46 (see FIG. 1), which may possibly emit white light, or light having a given spectral distribution. Backlight units are known per se.

Finally, a backlight unit controller 42 is used in the device to modulate one or more physical properties of light emitted from the backlight unit 40. Such properties may notably include the intensity and the spectral distribution (e.g., the average wavelength) of the backlight.

The modulation may in fact restrict, in simple scenarios, to a mere switch, whereby the backlight unit may be switched ON and OFF, under given conditions (e.g., a user actuates a switch or an illuminance sensor detects that an external illuminance threshold has been reached). In more sophisticated approaches, an ambient light sensor is used to progressively modulate the intensity of light emitted by the backlight unit. The backlight intensity may further be user-configurable, just like the modulation scheme, e.g., based on power consumption parameters and/or optical property preferences (contrast, brightness, etc.) selectable by the user.

The present approach extends the range of applications of known, reflective PCM-based display and allows a PCM-based, transflective display, which combines advantages of PCM-based displays and transflective displays, i.e., this approach allows a reflective display with backlighting, thus allowing it to be used in low light conditions while also allowing low power operation under ambient lighting. As explained below, the present approach leverages optical spacers, for them to have additional functionalities and enable transflective displays.

As it may be realized, the presence of the reflector(s) 15 does not hamper illumination from the backlight unit, owing to original display designs as proposed herein. Illumination from the backlight may involve the reflectors 15, in a direct or indirect manner. That is, illumination may occur directly through the reflector (when a direct backlight is used, the reflector being therefore partially transparent) or, when an edge backlight is used, thanks to optical structures arranged in the reflector or in the vicinity thereof so as to allow light to exit a waveguide used to propagate the backlight and reach the PCM pixels.

Remarkably, the spacers 14 may have multiple functions: not only they can be used to transmit or both propagate and transmit light but, in addition, their thicknesses may vary from one pixel to the other so as to exploit optical interference effects. Furthermore, they also serve as a channel to convey electrical or thermal energy needed to switch the PCM portions of the pixels.

Optically speaking, the spacers 14 serve as: (i) an optical layer in which light passes multiple times when light is simply reflected by the reflectors (reflective mode: the backlight is then low or OFF); and (ii) as a medium to transmit direct backlight or possibly as a waveguide to propagate light laterally emitted from an edge backlight unit. Thus, and as present inventors have realized, devices can be designed wherein materials forming the spacers 14 can be suitably selected and suitable structural arrangements can be devised so as for the spacers to fulfil a plurality functions, which mitigates the need for additional material layers or components. All this is now explained in detail, in reference to particular embodiments of the inventions.

Figure 10:
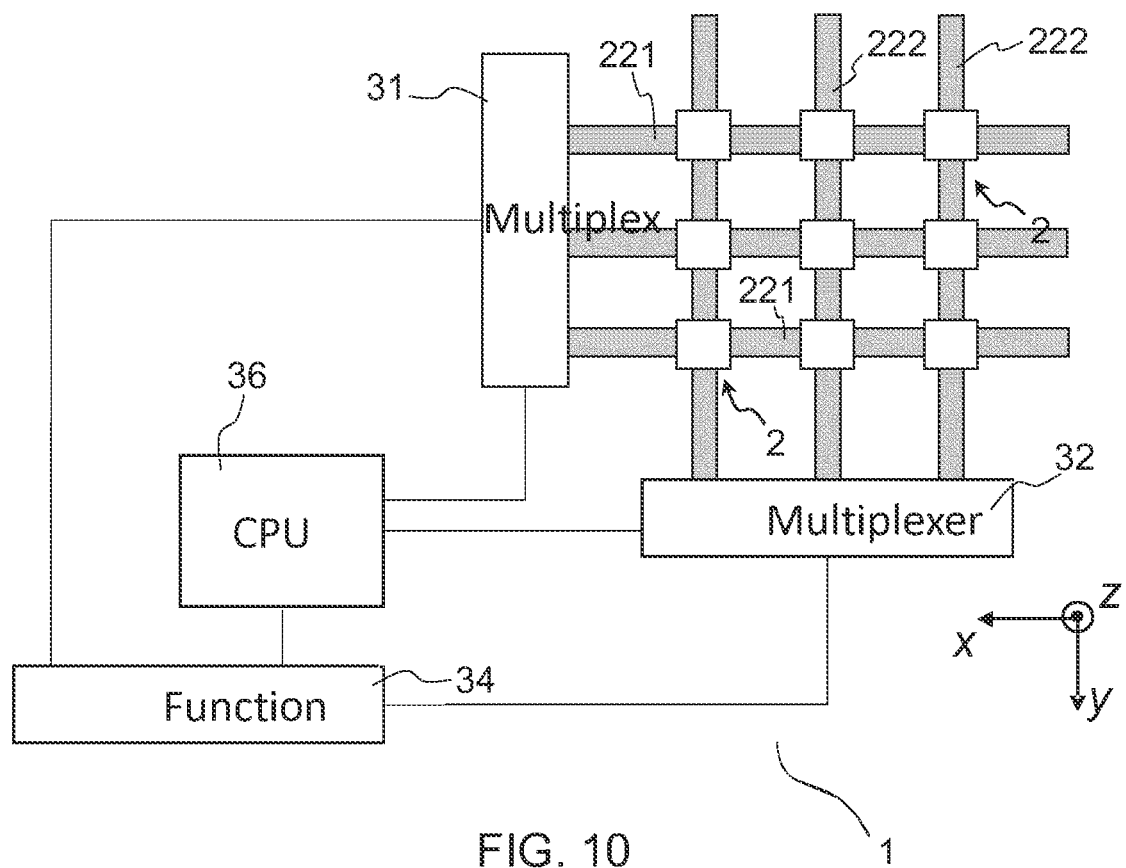
FIG. 10 is a schematic diagram of a passive matrix PCM-based, transflective display, according to embodiments.
Figure 11:
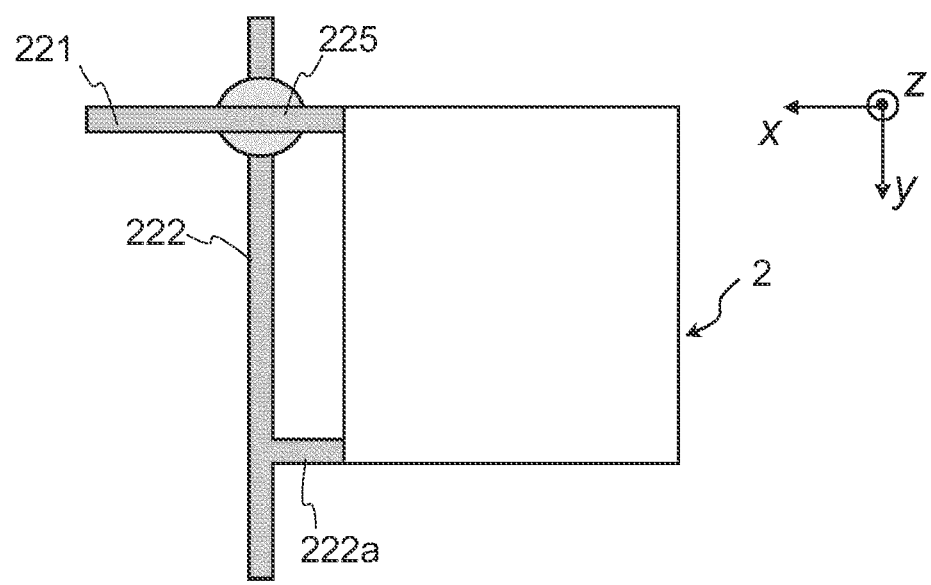
FIG. 11 is a top view of an offset PCM pixel structure, showing connections to electrodes at a crosspoint, as involved in embodiments.

Referring for instance to FIGS. 1, 10 and 11, the energization structure is preferably designed as a heating structure 17, 21, 221, 222. The latter is electrically insulated from the PCM portions 10 or, at least, the electrical conductivity of the spacers does not cause shorts to the PCMs (only a thermal switching is desired in that case). Still, the heating structure need be in thermal communication with the PCMs, via one or more optical spacers, e.g., via respective spacer layer portions of the pixels or a spacer layer shared by a subset or, even, the set of pixels.

The heating structure may for instance include a resistive heater 17 arranged between electrodes 221, 222, which are themselves connected to a circuit controlled by the controller 30, as assumed in FIG. 1, which only depicts a circuit portion connecting to one pixel, for simplicity. As shown in FIG. 1, the heater element 17 shall possibly extend under the reflectors 15. Yet, in variants, the heater element may extend laterally, e.g., at the same level as the reflector layer 15 or, even, be integral therewith (or form an integral part thereof).

In FIG. 1, the controller 30 is configured to energize the heating structure, an in particular the element 17, e.g., via electrodes 221, 222, in order to selectively heat PCM portions of the pixels. As a result, it is possible to reversibly switch a state of a PCM portion of any of the pixels from one of its reversibly switchable states to the other. If necessary, a non-linear element 21 is present (as in FIG. 1), for reasons that will become apparent later.

The heating structure may be electrically insulated from the PCM 10 thanks to the spacers 14, which can be made electrically insulating. Yet, electrical insulation can also be achieved thanks to another, electrically insulating layer of the stack, suitably located between the resistive heater element 17 and the PCM 10, such as the electrically insulating but thermally conducting layer 18 in the example of FIG. 1.

If the heater element 17 is located under the reflector 15 (as in FIG. 1) or form part or all of the reflector 15 (in which case the heater element 17 may be both reflective and resistively heating upon energization), then electrical insulation can notably be achieved by: (i) using a dielectric reflector or as a diffuse optical reflector; (ii) adding an electrically insulating layer, such as layer 18 in FIG. 1; or (iii) using an electrically insulating (yet thermally conducting) material for the spacers 14. At least, the electrical conductivity of the layer(s) used to prevent electrons from flowing into the PCM 10 should be sufficiently small, in comparison to that of elements 221, 21, 17, 222 involved in the circuit, to prevent electrical shorts to the PCM 10.

In variants to heating structures, the energization structure may involve electrodes and the PCM portions are, in this case, reversibly switchable by application of a voltage to the electrodes. The display controller is, in that case, adapted to apply a voltage, via the electrodes, to switch the material 10. For instance, the spacers 14 and capping layers 16 may also be used as electrodes for use in applying the voltage to the material layer 10, which is sandwiched between the electrodes 14, 16, exploiting similar principles as described in WO2015097468 (A1). Here again, the spacers have thus multiple functions.

As illustrated in the embodiments FIGS. 3-9, transflective display devices 1 *b*-1 *h* may be designed, wherein the reflector(s) 15 are configured as a reflective layer 15, e.g., a single layer, which extends under the whole set or a subset of pixels 2 *b*-2 *h*. This can for instance be the case in each of the embodiments of FIGS. 3-9, even if the latter depict one or a few pixels, for simplicity. I.e., a same reflective layer 15 may be used for all pixels or a subset thereof. If necessary, this reflective layer may be structured as in FIGS. 4-5 (where layer 15 comprises holes 152) or, more generally, comprise optical structures as in FIGS. 3, 6-8, so as to allow light to suitably exit or out-couple toward the pixels, in operation.

Similarly, embodiments disclosed herein rely on a spacer layer 14 that extends under several PCM pixels. Yet, the thicknesses of the spacer layer may need be varied from one pixels to the other, to exploit interference effects, which are dependent on the refractive index of the PCM material 10 and the thickness of the spacer 14.

Figure 2A:
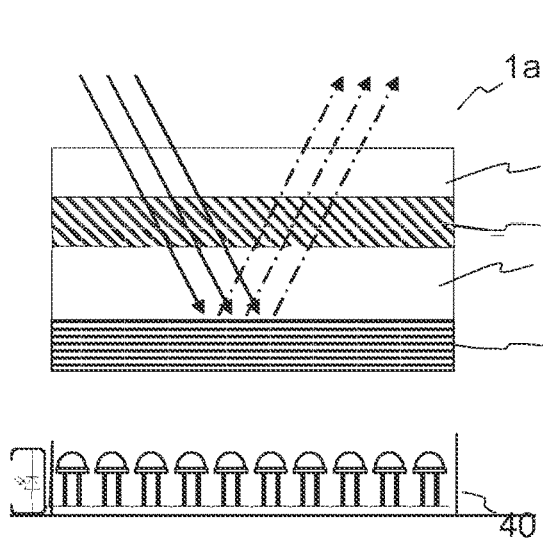
FIGS. 2A-2B illustrate the operation of a PCM pixel as in FIG. 1.
Figure 2B:
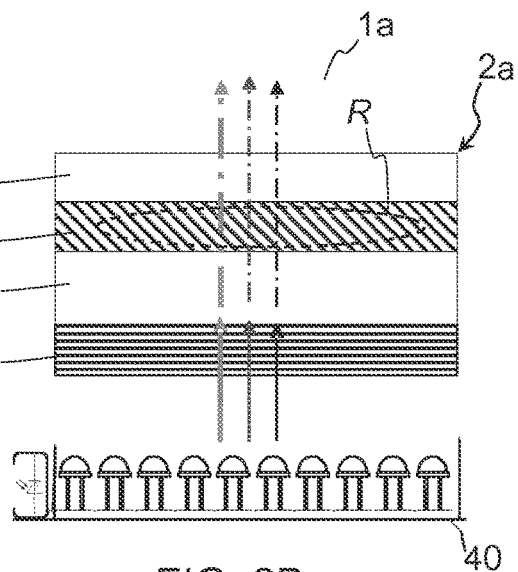

A first class of embodiments is now discussed in reference to FIGS. 2A-2B, which depict a transflective display device 1 *a*, wherein the backlight unit 40 is a direct backlight unit, as in FIG. 1. That is, the backlight unit 40 is arranged in the device to illuminate the PCM portions 10 from a backside of the device 1 *a*, opposite to the PCM layer 10 with respect to an average plane of the reflector 15. The reflector 15 may be made from a single layer extending under several pixels 2 *a* or, in variants, several reflector layer portions may be part of the layer structure of each pixel. In all cases, the reflector(s) need be partially reflective (and thus partially transparent), to allow transmission of light emitted from the direct backlight unit 40 (FIG. 2B).

The embodiment depicted in FIGS. 2A-2B is perhaps the easiest to fabricate, as no additional components (e.g., waveguide, cladding layers, or optical structures to optically guide or redirect light toward the PCM portions) are needed.

If a heating structure is used to switch the PCM pixels, then the spacers 14 may be made electrically insulating (or at least sufficiently insulating), to ensure electrical insulation from the heater element (see FIG. 1). This way, no additional layer is needed to achieve electrical insulation. Still, in variants, the spacers may be coated with an optically transmissive, thermally conducting but electrically insulating layer to achieve the same, or an electrically insulating layer 18 may be provided between the heater 17 and the reflector 15, as in FIG. 1.

As it can be realized, in embodiments where direct backlight is used, as in FIGS. 1-2, the reflector 15 need be partly transparent, which slightly impacts performance in terms of illumination and power consumption. Still, a trade-off can be found, wherein the reflector 15 is sufficiently transparent to allow a reflective display with backlighting, while the PCM material allows low power operation under ambient lighting. For instance, the reflector can be made from a silver layer (e.g., 30-50 nm thick) or from an aluminium layer (e.g., 20-40 nm thick), so as to achieve a reflectivity of 70-90%, e.g., 80%.

Else, an edge backlight may be preferred, as discussed below in reference to variants to FIGS. 3-7 and 9. In such embodiments, the transflective display devices 1 b-1 h comprise edge backlight units, arranged in the devices 1 b-1 h to illuminate the PCM pixels 2 b-2 h (and in particular the PCM 10 of such pixels) from a lateral side of the devices. Illumination occurs via one or more waveguides 11, 12, 14. These waveguides extend, each, in a same plane that is parallel to the average plane of the reflector(s) 15, i.e., parallel to (x, y) in the appended drawings.

In such embodiments, a nearly fully reflective mirror may be used, i.e., a reflector made from a material layer processed so as to provide a reflectance close to 100% in the visible spectral range, as assumed in the embodiments of FIGS. 3-9. However, additional components (optical structures 122, 124, 152) are needed to allow the backlight to exit toward the PCM pixels in such cases. Such components may additionally slightly impact the effective reflectivity of the mirror(s) 15.

Figure 9:
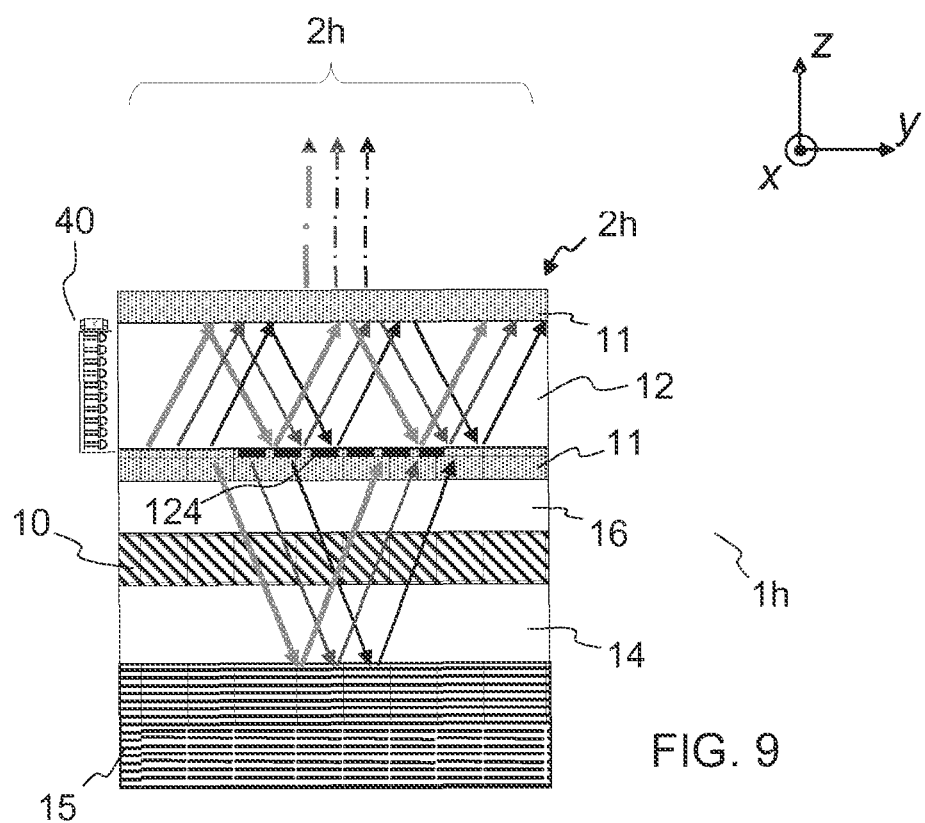

The waveguides may typically comprise pairs of cladding layer portions 11, on each side of a core material 14, 12 of the waveguides, as depicted in FIGS. 3, 9, to allow multiple internal reflections and hence propagate the backlight in the waveguides.

One may want to use dedicated waveguides to laterally propagate the backlight, as in FIGS. 4-7 and 9. However, the spacers 14 may advantageously be used as waveguides, to achieve the same, as illustrated in the embodiments of FIGS. 3 and 8. This way, no additional waveguides are needed. Yet, using additional waveguides 12 allows to partly decouple properties as needed, on the one hand, for reflection and, on the other hand, for backlight propagation. This, eventually, may be exploited to allow better control on the illumination of the display as the additional waveguides 12 can be optimised for illumination purposes.

Figure 3A:
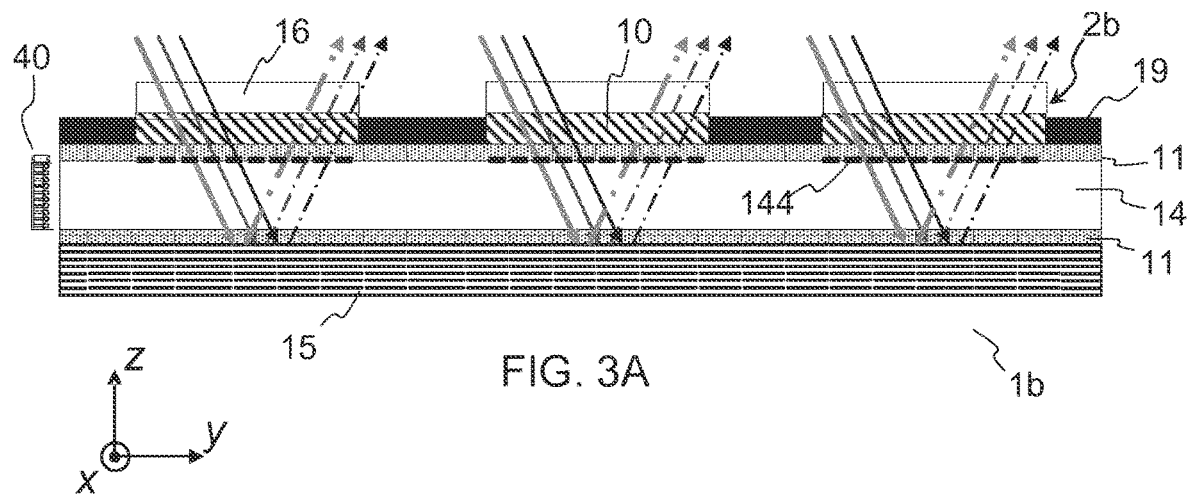
FIGS. 3A-3B illustrate the operation of a PCM pixel coupled to an edge backlight unit, where a spacer acts as a waveguide to propagate light emitted from the edge backlight unit, according to embodiments.
Figure 3B:
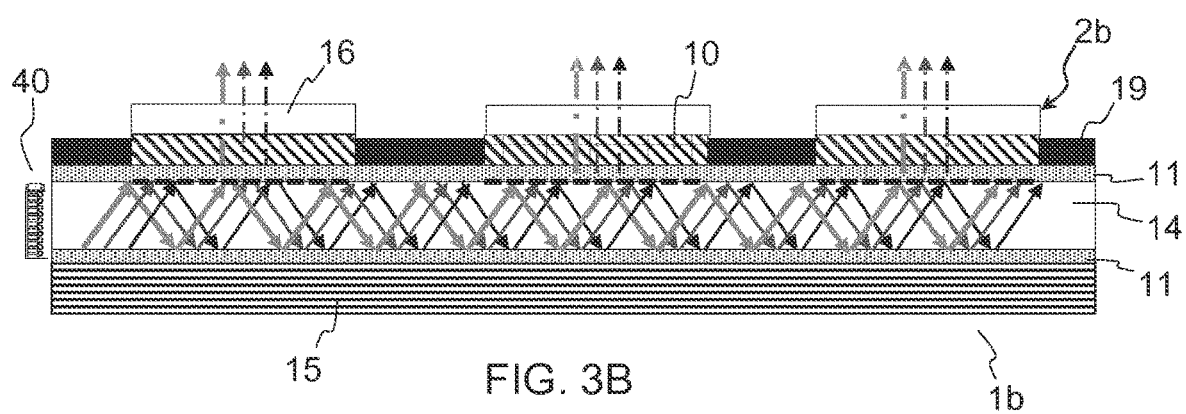

In the example of FIGS. 3A-3B, the transflective display device 1 b comprises one or more spacers 14 (below the PCM 10), which are cladded with cladding layers 11, so as to form waveguides that laterally propagate the backlight. The latter can reach the PCM portions thanks to microstructures 144 patterned on one or each of the cladding layers 11. The microstructures 144 are conveniently arranged, e.g., at the level of each pixel, to allow light emitted from the backlight unit 40 (and internally reflected in the spacers 14) to exit towards the PCM portions of each of the pixels 2 b, as depicted by arrows in FIG. 3B. Thus, the spacers 14 can also be used as waveguides to convey light from an edge backlight unit 40, so that no additional waveguide is needed in that case.

The microstructures 144 typically comprise patterned features that are designed to allow light to be redirected or out-coupled toward the PCM pixels. Convenient designs of microstructures are known per se. In variants, other optical structures could be used to achieve the same, such as holes 152 (holey minor structure) and/or lensed elements 122, as used in the embodiments of FIGS. 4-5. Examples of suitable microstructures are for instance described in the following papers: "Optimized pattern design of light-guide plate (LGP)", by Y. C. Kim and co-workers, Optica Applicata, Vol. XLI, No. 4, 2011; and "Light-guide plate using periodical and single-sized microstructures to create a uniform backlight system", by J. W. Pan and Y. W. Hu, Optics Letters Vol. 37, issue 17, 2012.

If, instead of re-using the spacers 14, additional waveguides 12 are used, then an option is to use a separate waveguide on top of the PCM pixels, as in the example of FIG. 9. Here, the transflective display device 1 b comprises one or more waveguides 11, 12 arranged on top of the PCM portions 10, i.e., opposite to the one or more reflectors 15, with respect to the PCM portions 10. In such a case, the additional waveguide layers 11, 12 (including cladding layers 11) need be designed so as to have as little impact as possible on light reflected from the reflectors 15 and passing through the PCM pixels, so as to minimize the impact on optical properties of the display device 1 h.

Else, the additional waveguide 12 may be arranged below the PCM pixels, as in FIGS. 4-7. In these examples, the transflective display device 1 c-1 f comprise a reflective layer 15 that extends below the spacer layer 14, while an additional waveguide core 12 extends below the reflective layer 15, opposite to the spacer 14 with respect to the reflective layer 15. In order to allow the backlight propagated in the waveguide 12 to exit toward the pixels 2 c-2 f the devices 1 c-1 f further comprise optical structures 122, 124, 152, which are arranged in (structures 122, 152, FIGS. 4-5) or on (microstructures 124. FIGS. 6-7) the reflective layer 15. In variants, or in addition, optical structures can be located in the vicinity of the reflective layer 15, such as lenses 122 in FIG. 5. In all cases, such optical structures are arranged with respect to the pixels 2 c-2 f so as to allow the backlight emitted from the unit 40 and internally reflected in the waveguide 12 to exit toward a PCM portion of each of the pixels 2 c-2 f.

In such embodiments, the waveguides 12 are distinct from the spacer(s) 14 and arranged below the pixels, so as not to impact light reflected from the reflector 15 toward the PCM pixels. Yet, optical structures are needed for the backlight to exit toward the pixels. Such optical structures can thus be regarded as optical coupling structures or exit structures. They are optical elements designed for redirecting light, out-coupling it or more generally allowing it to exit toward the PCM pixels. Waveguides as described in US2003067760 (A1) may for instance be used in the present context.

Figure 4:
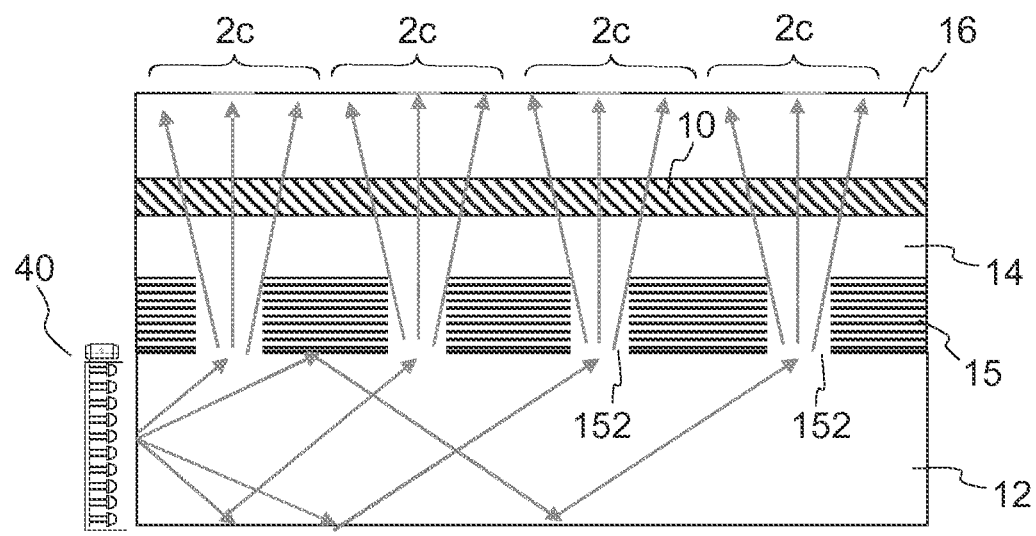
Figure 5:
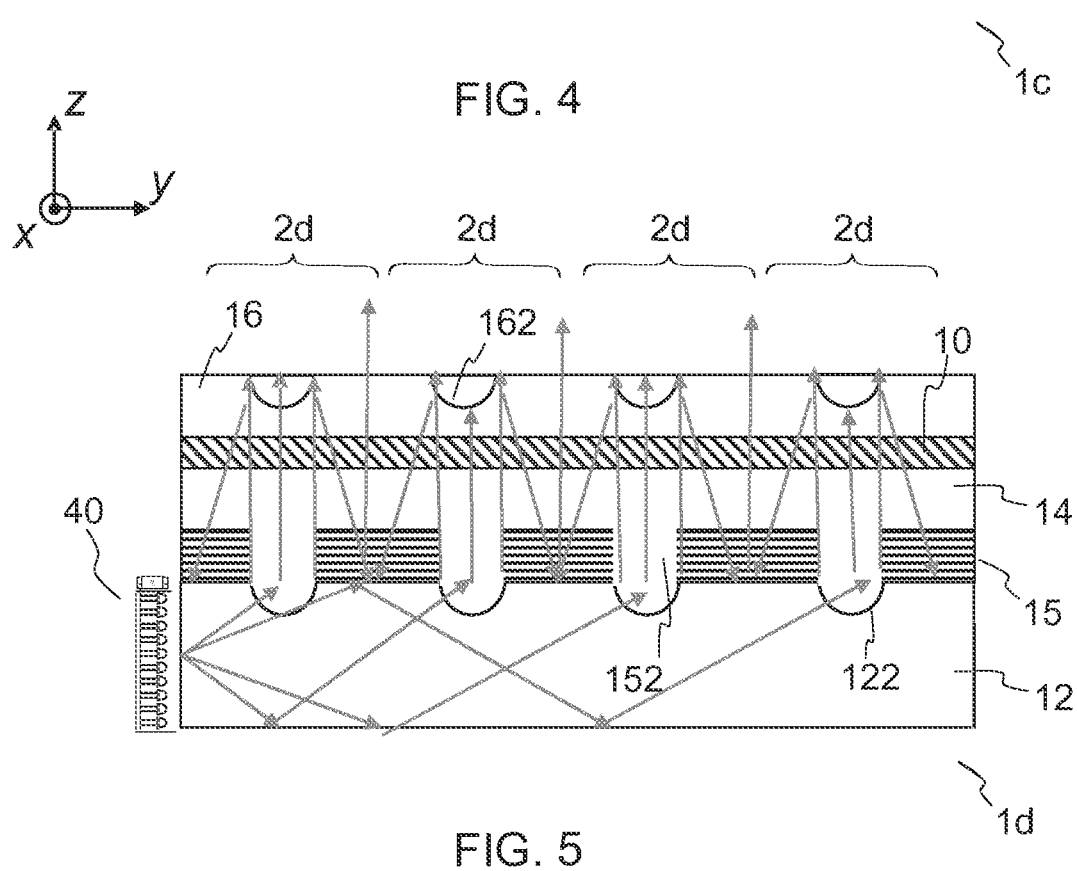

These optical structures may for example be arranged at an interface with reflective layers 15, as in FIGS. 6-7, or within a reflective layer (as in FIG. 4), or a combination of different types of optical structures 122, 152 can be used, as in FIG. 5.

Different types of optical structures may be used (possibly in combination), as illustrated in FIGS. 4-8. For example, lensed structures 122 may be used, at an interface with the reflective layer 15 (FIG. 5). In addition (FIG. 5), or independently (FIG. 4), holes 152 may be used, which are provided (as through holes) in the thickness of the reflective layer 15, i.e., so as to achieve a holey mirror structure. Else, microstructures 124 can be patterned on the reflective layer 15 or in a layer 13 in contact therewith, as in FIGS. 6-7. Other types of optical structures can be contemplated, such as scattering features 126 (as used in FIG. 8).

In other variants, a hollow box (not shown) underneath the PCM pixels may be structured so as to suitably reflect light as needed to direct it toward the PCM pixels.

Figures 6A, 6B:
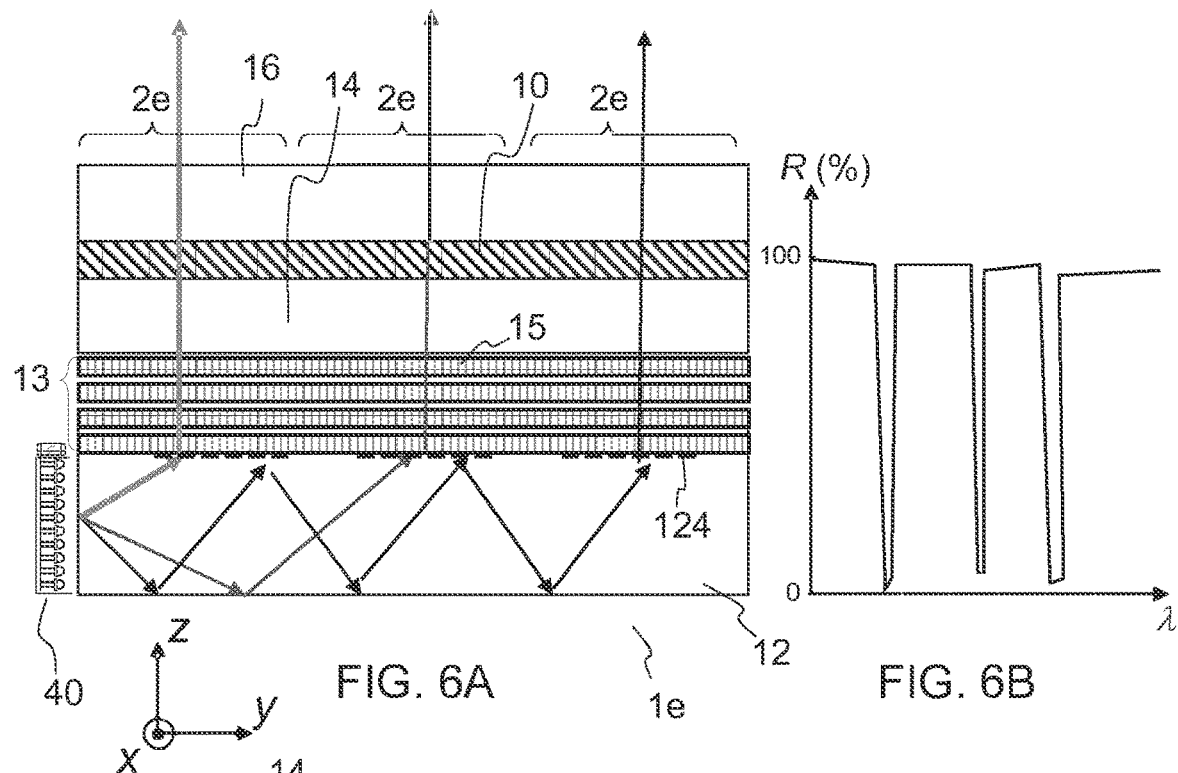

Referring now to FIG. 6A, a transflective display device 1 e may, in embodiments, comprise a narrow-band pass filter 13. The filter 13 typically includes a stack of layers, wherein one or more of the layers may act as reflective layers 15. The stack 13 of layers is otherwise designed so as to filter a spectral range of light that exit toward the PCM portions 10 from the waveguide 12, in operation. The narrowband filter conditions the spectral range of the backlight from the waveguide 12 which passes through the PCM stack, affording more precise control of the spectral characteristics of each pixel.

Figures 7A, 7B:
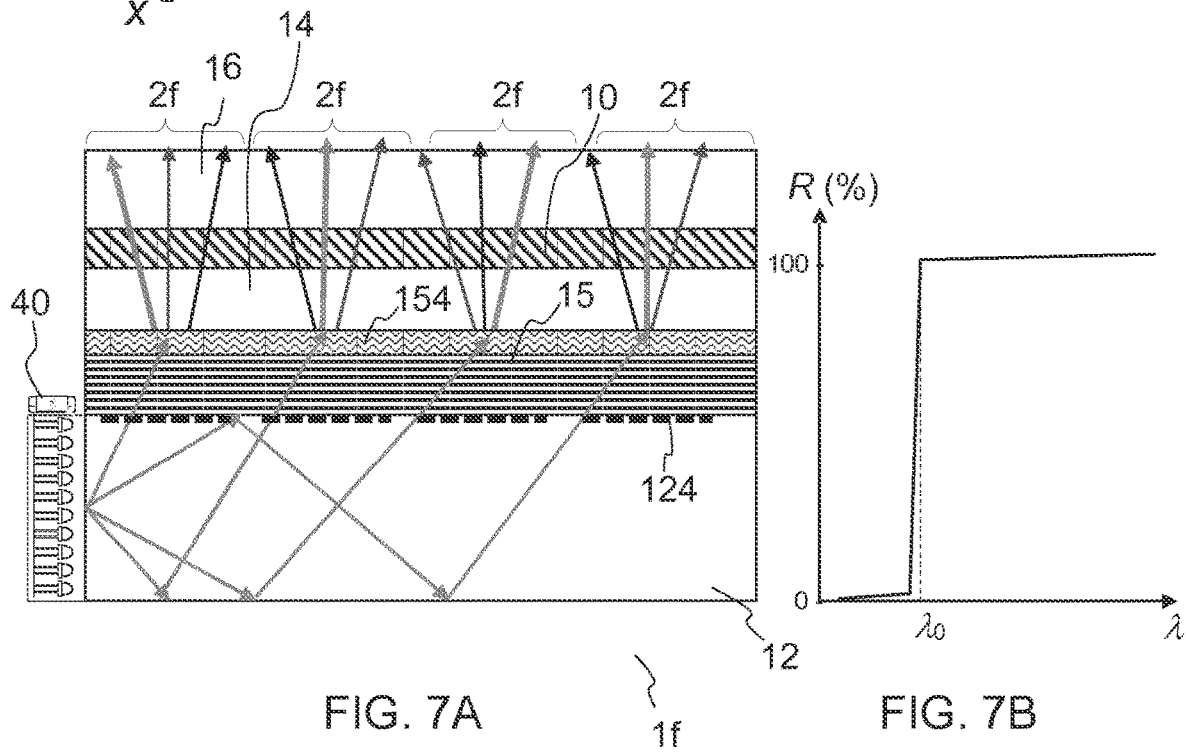
Figure 8:
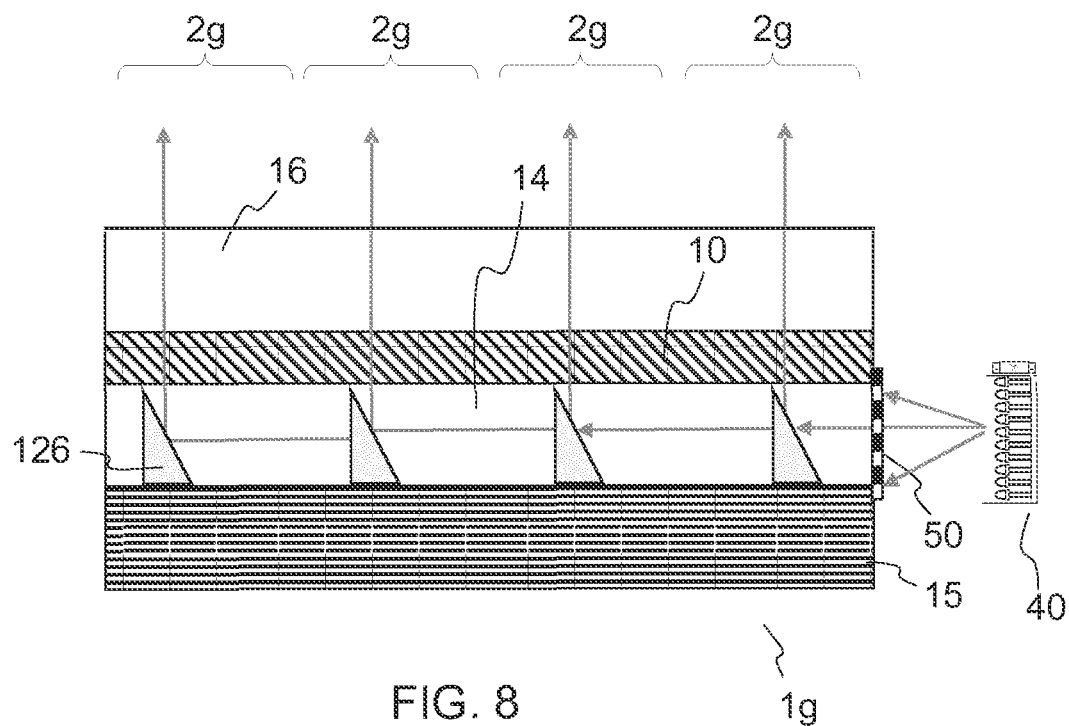

Next, as illustrated in FIG. 7A, a transflective display device 1f may, in embodiments, further comprise a wavelength shifter 154 on top of the reflective layer 15. The wavelength shifter is located opposite to the waveguide 12 with respect to the reflective layer 15, e.g., in direct contact with the reflector 15. The wavelength shifter 154 absorbs higher frequency photons and emits lower frequency photons. Different types of wavelength shifters can be contemplated. For example, it may consist of a mere photofluorescent material (phosphor). In variants, the wavelength shifter may be implemented as a set of quantum dot structures. In all cases, the wavelength shifter is arranged on top of the reflector(s), such that UV illumination from sunlight can be converted to visible light to increase brightness. Yet, as it may be realized, using a quantum dot structure may allow better efficiency and/or emission matching to pixel reflectivity, compared to a phosphor layer.

In embodiments, the pixels 2, 2 a 2 b of the display devices 1, 1 a-1 b have a layer structure that includes a distinct, bi-stable PCM layer portion for each of the pixels, as assumed in FIGS. 1-3. That is, each pixel includes a respective PCM layer portion (i.e., a well delimited portion of layer). The PCM layer portions may nevertheless be initially obtained from a same PCM layer, which is subsequently processed so as to give rise to distinct layer portions. Relying on distinct PCM layer portions mitigates the risk of inadvertent switching of neighbouring PCM regions.

In variants, a same PCM layer may be used for a set or a subset of the pixels, as in the embodiments of FIGS. 4-8, which simplifies the fabrication of the pixels. Yet, as noted above, additional optical structures 122, 124, 126, 152 are needed in such cases, which define the pixels, as explicitly shown in FIGS. 4-8. Note that distinct PCM layer portions may nevertheless be used in place of the continuous PCM layer 10 in the embodiments of FIGS. 4-8. Similarly, both options are possible for the embodiment of FIG. 9.

In embodiments, the layer structure of each of the pixels 2, 2 a-2 h includes a capping layer 16 above the PCM 10, as in FIGS. 1-9. The capping layer 16 is opposite to the spacers 14 with respect to the PCM 10. The capping layer 16 preferably comprises a same material as the spacers 14.

The capping layer 16 can be made electrically insulating, unless the PCM is electrically switched and the capping layer is located between electrodes or serves as one of the electrodes. Each of the capping layer and the spacer may for instance comprise titanium oxide, zinc oxide or indium tin oxide. As the skilled person will appreciate, the thicknesses of the layers 14, 16 may need be refined, to make sure that the layers are sufficiently conductive (electrically) or, conversely, sufficiently insulating. For instance, a layer of indium tin oxide would typically need be at least 10 nm thick to become sufficiently conductive (electrically) for embodiments where the PCM 10 is electrically switched. As mentioned earlier, the spacers 14 and capping layers may be used as electrodes in that case.

It should be noted that either or both of the spacer layer 14 and the capping layer 16 may comprise composite layers, which comprise multiple layers of material having different refractive indices, so as to achieve the desired optical properties.

Referring now more particularly to the embodiment of FIG. 5, the capping layer 16 of the device 1 d may further comprise reflective optical structures 162, such as flat mirrors or lenses. The optical structures 162 are configured to reflect inner light (emitted from the backlight unit 40 and out-coupled toward the pixels) toward the reflector(s) 15. The reflective structures 162 can notably be arranged in an array, which can be designed optically to modify the performance of the device. In particular, spatial tuning can be exploited to effectively change the spectral transfer function of the PCM stack, which, in turn, allows more flexibility in the design of the display.

Thus, present devices may comprise as set of pixels having spacers of substantially different thicknesses. For example, each pixel may decompose into a subset of sub-pixels that have spacers of distinct thicknesses.

Figure 12:
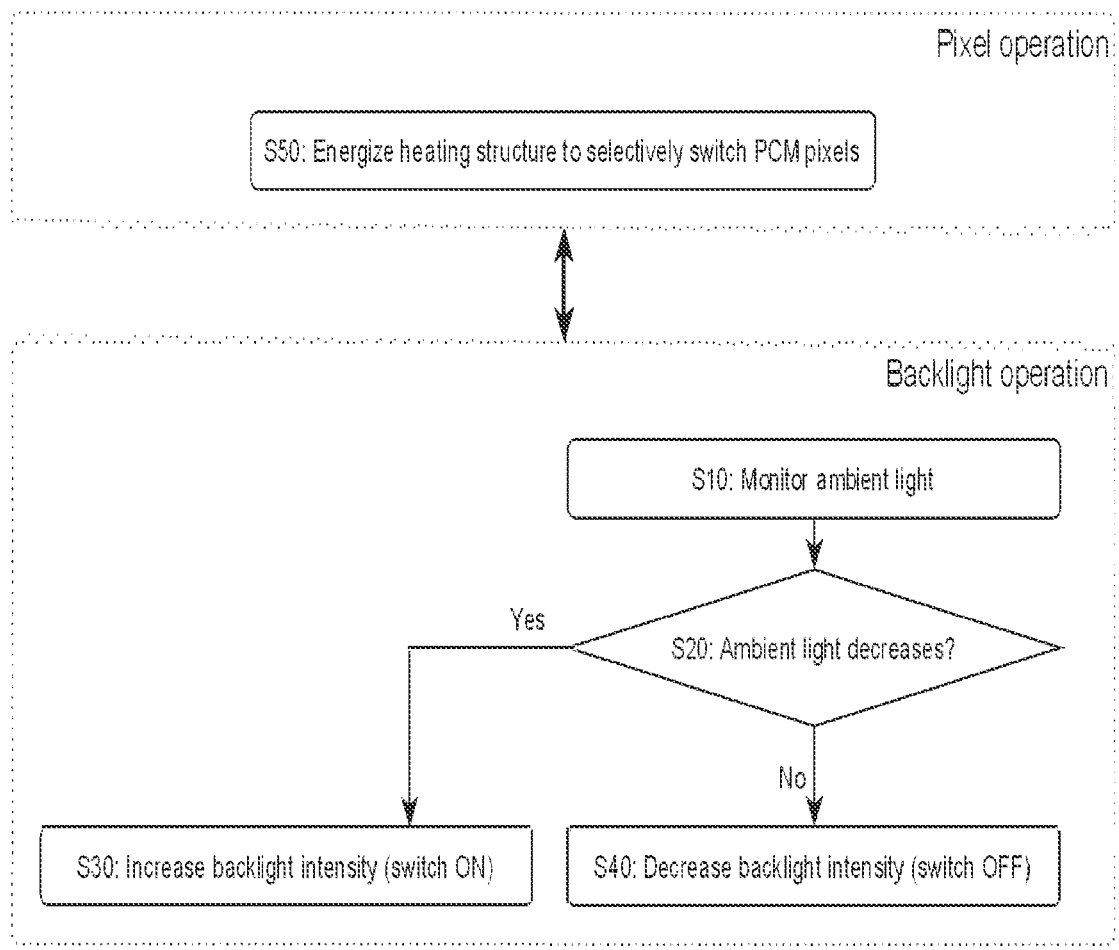
FIG. 12 is a flowchart illustrating high-level steps of operation of a display device according to embodiments.

According to another aspect, the invention can be implemented as a method of operating a display device such as described above. In reference to the flowchart of FIG. 12, this method basically comprises two main steps, which are typically concurrently implemented.

On the one hand, the display controller is used to selectively energize S50 the pixels, via the energization structure. For example, and as discussed earlier, the display controller selectively heats the pixels, so as to reversibly switch a state of PCM portions thereof.

On the other hand, the backlight unit controller 42 modulates S30-S40 physical properties of light emitted by the backlight unit 40, such as colours and intensity. As explained earlier, the modulation may restrict to merely switching the backlight ON or OFF, as illustrated in FIGS. 2A-2B or 3A-3B, which amounts to abruptly modulate the light intensity.

In variants, progressive modulation may be contemplated. In a typical application, the external illuminance (ambient light) is monitored S10-S20 with an illuminance sensor, and physical properties of light emitted by the backlight unit are modulated S30-S40 based on the monitored external illuminance, so as to adapt optical properties of the display to ambient light conditions. More details as to the operation of the present devices are given in the next section.

The above embodiments have been succinctly described in reference to the accompanying drawings and may accommodate a number of variants. Several combinations of the above features may be contemplated. Examples are given in the next sections.

2. Detailed Description of Display Devices as Depicted in FIGS. 1-9 and Their Operation 2.1 FIGS. 1, 2A and 2B As described in sect. 1, the devices depicted in FIGS. 1-2 involve a portion of active solid state material 10 provided in the form of a layer or a layer portion. The material of this layer has a refractive index and/or an optical absorption that is permanently, yet reversibly, changeable as a result of, e.g., a transition from an amorphous to a crystalline state.

The material 10 is arranged above a reflector 15, which in this embodiment is a layer of metal such as platinum or aluminium that is thick enough to reflect a substantial proportion of incident light, but not too thick, to allow transmissive backlight. A spacer layer 14 is sandwiched between the material 10 and the reflector 15. A capping layer 16 is provided on top of the material layer 10. The upper surface 16 s of the capping layer 3 constitutes the viewing surface 16 s of the display device 1, 1 a, and the reflector 15 is a back-reflector. Light enters and leaves through the viewing surface 16 s as indicated by the arrows in FIG. 2A. However, because of interference effects which are dependent on the refractive index of the material layer 10 and the thickness of the spacer 14, the reflectivity varies significantly as a function of wavelengths of light. The spacer 14 and the capping layer 16 are both optically transmissive, and are ideally as transparent as possible.

Either or both of the spacer layer and capping layer may comprise "composite" layers of multiple layers of material having different refractive indices. In this way, further partial internal reflections are generated at the interfaces of these multiple layers, providing the possibility of more complex interference modes which may allow increased control of the reflection spectra of the available states. To that aim, the refractive index of the capping layer would typically be at least 1.6, and preferably at least 1.8, 2.0 or, even 2.2. This allows: (i) reflection spectra with high reflectivity to be generated over a narrow range of wavelengths, producing more vivid colours and thereby a larger colour gamut; and (ii) the desired reflection spectra to be more independently tuned in the multiple states of the device.

The division of the capping and spacer layers into composite layers can for instance be done using materials that may include, e.g., ZnO, TiO$_2$, SiO$_2$, Si$_3$N$_4$, TaO and ITO.

For switching large area pixels, a thermal switching mechanism is preferred to voltage-actuated switching. In FIG. 1, the layer stack 15-14-10-16 is accordingly deposited on a barrier layer 18 (which preferably comprises silicon nitride, SiN$_x$, although SiO$_2$ may be used, in variants), which provides electrical insulation but has a very good thermal connection to the resistive heater element 17. The barrier layer 18 is an electrical insulator that is thermally conductive such that the barrier layer 18 electrically insulates the resistive heater element 17 from the PCM element 10, but allows heat from the resistive heater element 17 to pass through the barrier layer 18 to the PCM element 10. This way, one can switch the state of the PCM element, e.g., between a crystallized state (in response to a first heat profile applied) and an amorphous state (in response to a second heat profile applied).

The layer structure shown in FIG. 1 is provided on a substrate 23. Examples of materials for the various layers 10-18, 21, 23 are given in section 3.1.

The layers are deposited using sputtering, which can be performed at a relatively low temperature of 100 C. The layers can also be patterned as required, using conventional techniques known from lithography, or other techniques, e.g., from printing. Additional layers may possibly be present in the layer structure, if needed.

The device depicted in FIG. 1 can be made to appear a uniform colour, which can then be switched to appear a contrasting colour, or to appear much darker or lighter by changing the reflectivity. Many layer stacks such as the stack 2 in FIG. 1 are fabricated adjacent to each other in an array, with each structure being individually electrically controllable and constituting a pixel (or a subpixel) of the overall display. In variants, each pixel can comprise a cluster of distinct layer stacks such as the stack 2 of FIG. 1, adjacent to each other, wherein each layer stack in the cluster has a different thickness of spacer layer 14, to exploit interference effects and achieve different colours of the (sub)pixels.

Advantageously, the location of the heater 17 in the stack does not perturb the ordered sequence of layers 10-14-15, which can, in turn, be optimized in terms of their optical properties. This allows the spacer thickness to be adjusted, e.g., for each pixel or subpixel, so as to leverage interference effects that depend on the refractive index of the PCM 10 and the thickness of the spacer 14. Thus, there is no need to use colour filters, though such filters may be used, complementarily to the spacers, if needed, e.g., to further adjust optical properties. Moreover, the device may include optical attenuators or electro-optical attenuators or, still, any filter configured to obtain a desired display shade.

The structure of FIG. 1 makes it possible to exploit the fact that the reflectivity will vary significantly as a function of wavelengths of light, because of interference effects which are dependent on the (complex) refractive index of the PCM and the thickness of all the layers of the optical stack, including that of the PCM itself. As a result, optical properties of the device can be tuned thanks to the spacer (e.g., to confer a "colour" to a subpixel), without requiring additional filters. Thus, present devices can be designed so as to leverage two optical functions, while allowing a large portion of the PCM to be switched, thanks to the thermal activation.

In addition, the heating element 17 need not be made transmissive to light, as it would if it were in direct contact with the PCM, i.e., above the reflector. It can instead be optimized in respect of its desired electrical/thermal properties (e.g., to obtain a high resistance).

In FIG. 1, the heater 17 is connected in series between low resistivity electrodes 221, 222, below the reflector 15, to optimize power conversion while energizing the pixel and minimize power consumption. This further simplifies the overall structure, inasmuch as the sole electrical contacts are on the backside of the structure 2, without electrodes sandwiching the active optical regions being needed.

Moreover, a (strong) nonlinear element 21 is preferably inserted in series in the current paths, to more selectively heat the heater and, in turn, switch the PCM. This is useful in passive matrix displays, where PCM pixels are connected across junctions of intersecting crossbar electrodes of a matrix address structure, to avoid 'sneak paths' currents between neighbouring pixels, as discussed in section 3.

A (simple) operation of a pixel structure as shown in FIG. 1 is illustrated in FIGS. 2A-2B. For simplicity, heater structures are not shown in FIGS. 2A-2B an in subsequent drawings. However they can in principle be positioned anywhere that affords a good, thermally conductive link to the PCM layer 10.

As mentioned earlier, the reflector 15 is partially transparent and partially reflective. The backlighting system 40 typically comprises LEDs 46, although other light sources could be used. The LEDs could be white or RGB and provide uniform overall illumination for the display. Preferably, the reflector 15 is made of aluminium; it is thin enough to permit light from the direct backlight to pass through at sufficient intensity. The reflector 15 is preferably designed so as to have a reflectivity that is between 70% and 90%, e.g., of 80% (and a transmission of 20%).

In FIG. 2A the ambient light levels are sufficient for the light reflected from the mirror 15 to be visible and the backlight is OFF. The arrows show that, in the reflective mode, light passes in and out via the capping layer 16, thus passing through the PCM stack 14-10-16 twice, although some light will be lost via transmission through the thin mirror 15. In FIG. 2B, at low ambient levels or darkness, the backlight is switched ON and the light from the LEDs follows the path indicated by the arrows, passing through the mirror 15 and the PCM stack just once. The intensity of the backlight can typically be adjusted to provide a suitably bright display for the user.

The reflective and transmission modes of operation involve one and two passes through the PCM stack, respectively. It is to be expected that the colours produced in each case would be different for ambient light and backlight of the same spectral composition. However it is possible to vary the spectral composition of the backlight to compensate for this, thus balancing the colour in both modes of operation.

A similar type of compensation can be implemented in each embodiment where the two modes involve different numbers of passes, e.g., as in FIG. 3. Thus, present methods preferably comprise an additional step of varying the spectral composition of the backlight to compensate for differences in colours of the display that arise due to the reflective and transmission modes of operation.

A further improvement may be to mount the backlight LEDs in a reflective enclosure, increasing the intensity of light directed through the PCM stack.

Since each pixel can be used for both reflective and transmissive operations, the overall resolution of a transflective PCM based display remains the same irrespective of the operational mode and level of illumination.

As the skilled person will appreciate, many of the design options discussed in sect. 2.1 may also be contemplated in the embodiments of FIGS. 3-9.

2.2 FIGS. 3A-3B

FIGS. 3A-3B illustrate an embodiment in which the spacer layer 14 serves both as a waveguide to back illuminate the PCM stack elements and also as a spacer layer for tuning the colour of each PCM pixel, as previously described. Under high levels of ambient light, the backlight is OFF (FIG. 3A), the ambient light passes through the PCM stack and is then reflected back by the mirror 15, which is thick enough to ensure high levels of reflectivity. The passage of the light is as indicated schematically by the arrows in the drawings (here different dash types are used to denote different wavelengths of incident/reflected light. The cladding layers 11 on either side of the waveguide-spacer layer 14 play no substantial role in this case as light is essentially passing through them.

In FIG. 3B, the ambient light levels are low and the backlight is switched ON to launch light into the waveguide from a lateral side (perpendicular to the stacking direction z of the layers). The layers 11, which are of lower refractive index relative to the waveguide-spacer 14, serve as cladding to the waveguide to ensure total internal reflection occurs at the interface and allow the waveguide to propagate a range of modes. The waveguide 11, 14 may propagate a wide range of modes and hence provide substantially white illumination. In variants, a more restricted range of modes may be employed, depending on the desired design and application.

Irrespective of the modal propagation of the backlight, it is necessary to couple light out from the waveguide-spacer 11, 14 and through the stack, as illustrated by the vertical arrows.

This can typically be achieved by use of a microstructured exit surface 144 at the side face of the waveguide, as assumed in FIG. 3. In variants, the cladding could be reduced in thickness or eliminated altogether in the region of PCM stack-waveguide coupling. Other techniques known in the art could be used as well.

A blackout matrix 19 is used between the pixels 2 b to ensure no light leaks around the pixels.

In FIGS. 3A-3B, three pixels are illustrated, which could function as the RGB pixels of a display, for example. The individual colour can be adjusted using the PCM stack as a filter, e.g., by tuning the thickness of the PCM stack as a whole, in which case each stack would be different and customised according to the output colour required. The single pass operation of the backlight mode would also need to be taken into consideration. Still, several options can be contemplated, as discussed below.

For example, it is possible to selectively couple different colours from the waveguide-spacer 11, 14 using microstructured exit surfaces 144, in which case the PCM stack would operate predominantly as a controller of the intensity. In variants, the waveguide itself propagates only selected colours hence contributing to the colour of each pixel. In other variants, a range of different colours are injected into the waveguide 11, 14, providing further control of the spectral characteristics of the display. Combinations of the above options can be employed to ensure the display has the appropriate colour gamut required for transflective operation.

2.3 FIG. 4

FIG. 4 illustrates another embodiment, operated while the backlight is ON. An additional waveguide 12 is used. Unlike FIG. 9, the embodiment of FIG. 4 uses an additional waveguide 12 located beneath the reflector 15. Yet, the reflector 15 includes a series of apertures 152 beneath (or, in variant, reaching the edge of the PCM layer 10). The apertures can be fabricated by lithography or other techniques known in the art. Light propagates from the backlight 40 at the edge of the waveguide 12 by total internal reflection at the reflector-waveguide interface. The apertures 152 in the mirror layer 15 nevertheless allow light to escape from the waveguide 12 and reach into the upper PCM stack 14-10-16 (which here can be made to extend to a subset of even the whole set of pixels), and exit the device on top towards the viewer.

Note that claddings (not shown in FIG. 4) would typically be required for the waveguide 12, although the reflector 15 may already play the role of a cladding on top of the waveguide 12 (a cladding layer between the waveguide 12 and top reflector 15 may improve performance though). Thus, a reflector, a cladding layer, or an air gap may be provided on the bottom edge of the waveguide core 12.

When the ambient light level is sufficiently high, the backlight can be switched off and ambient light passes through the PCM stack to the mirror where it is reflected back through the PCM stack to the viewer.

2.4 FIG. 5

FIG. 5 illustrates a variant to FIG. 4, wherein the additional waveguide 12 incorporates a lens array 122 patterned at the interface with the reflector 15, so as for apertures 152 in the reflector 15 to be aligned with the lens array. A similarly aligned mirror array 162 is patterned in or on the capping layer 16.

In low ambient light the backlight is ON and light propagates down the waveguide 12, just as before. The lenses 122 intercept the light and focus the light upwards through the reflector 15 towards the mirror array 162. The light passes through the PCM stack 14-10-16 and is intercepted by the mirror array 162, for it to be then reflected back through the PCM stack and, in turn, reflected back again by the reflector 15. The light typically passes through the stack a maximum of three times, but the arrays can be designed optically to achieve an intermediate level of performance. An arrangement as shown in FIG. 5 makes it possible to effectively change the spectral transfer function of the PCM stack, affording greater flexibility in the design.

2.5 FIGS. 6A-6B

FIG. 6A illustrates an embodiment in which a narrow band pass filter 13 is placed below the PCM stack 14-10-16 and above the waveguide 12. A typical spectral transmission curve of the narrow band filter 13 is illustrated in FIG. 6B.

In low ambient light the backlight is ON and the light propagates down the waveguide 12. Light is coupled out of the waveguide 12 using microstructures 124 or, in variants, other exit coupling structures as listed in sect. 1, and passes through the narrowband filter 13. The narrow-band filter 13 further conditions the spectral range of the backlight from the waveguide 12 which passes through the PCM stack 14-10-16, affording more precise control of the spectral characteristics of each pixel.

2.6 FIGS. 7A-7B

FIG. 7A illustrates a further embodiment, wherein a layer of phosphor 154 is positioned between the PCM stack 14-10-16 and the reflector 15. A backlight source (typically operating in the UV/blue region of the spectrum) is coupled into the waveguide 12 and this light propagates down the waveguide 12, as before. Light is then coupled out of the waveguide and through the phosphor layer, e.g., using microstructures 124 provided at an interface with the reflector 15. The phospor layer 154 down-converts UV/blue illumination to visible after transmission through the reflector 15, which has typical spectral characteristics as shown in FIG. 7B. In this way, light can be efficiently coupled into the PCM stack 14-10-16, while ensuring that ambient light in the visible regime is strongly reflected by the reflector 15, and this, without apertures in the reflector being necessary involved.

The use of a phosphor has the added advantage that UV illumination from sunlight is converted to visible light for a further increase in brightness. Instead of a photofluorescent layer, a quantum dot structure could be used to improve the efficiency and/or emission matching to pixel reflectivity.

2.7 FIG. 8

FIG. 8 illustrates a variant to the embodiment of FIG. 3, wherein the spacer layer 14 similarly operates as a waveguide illuminated by an edge backlight 40. The coupling between the backlight and the waveguide-spacer 14 is optimised using a diffractive optical element 50, such that no cladding is necessary. Here, the waveguide-spacer layer further incorporates scattering features 126 that have a same or similar function as the microstructures incorporated in the cladding of FIG. 3. The features 126 coincide with the position of pixels and thereby direct light towards the upper PCM stack 14-10-16. Alternatively on a finer scale, such features 126 may be used to control the spatial distribution of illumination passing through individual PCM stacks, to optimise the optical properties of the display.

2.8 FIG. 9

Another embodiment is illustrated in FIG. 4, in which an additional waveguide 12 is now positioned above the PCM layer stack in a front light configuration. In FIG. 4, the ambient light is assumed to be low and the backlight is ON. The light is coupled into the waveguide 12 from the edge backlight 40 and propagates through the waveguide 12, confined by cladding layers 11. The propagating light reaches a coupling area 124 at which point it is scattered downwards into the PCM layer stack from above. As assumed in FIG. 9, the coupling area 15 can be a microstructured surface which preferentially directs light towards the PCM stack 14-10-16 rather than towards the viewer. As a result of light being coupled into the lower stack 15-14-10-16, the latter operates as a reflective system in which the reflector 15 is sufficiently thick to reflect (almost) all the light from the waveguide 12 back through the PCM stack 14-10-16, and back through the waveguide 12 and out of the display to the viewer (on top).

As the waveguide 12 is not part of the PCM stack, it can be here again be optimised for illumination without having to take into account the operation of the PCM stack.

3. Specific Embodiments and Technical Implementation Details 3.1 Layer Materials and Dimensions Preferably, the PCM 10 comprises or is composed of $Ge_2Sb_2Te_5$ (also known as GST). Still, other materials may be used, including compounds or alloys of the combinations of materials selected from the following list: GeSbTe, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb, is also understood that various stoichiometric forms of these materials are possible. For example, beyond $Ge_2Sb_2Te_5$ (GST), other stoichiometric forms of $Ge_xSb_yTe_z$ may be used. Another suitable material is $Ag_3In_4Sb_{76}Te_{17}$ (also known as AIST). Furthermore, the PCM 10 may comprise one or more dopants, such as C or N.

The layer or layer portions 10 are preferably less than 100 nm thick, and preferably less than 10 nm thick, such as 6 or 7 nm thick.

Preferred PCMB are those that favour uniform (bulk) switching, i.e., involving a large portion of material in the switching process, as opposed to filamentary switching. However, the system may be designed to allow the formation of multiple (parallel) filaments, which, eventually, may also convene for the present purpose. Yet, if the thickness of the PCM is too high, it may not ensure a proper switching, hence the need to restrict the thickness of the PCM layer, as exemplified above.

For embodiments relying on PCM's states of distinct refractive indices, a difference of at least 0.2 over at least part of the visible wavelength range is typically needed for the refractive indices of the two states of the PCM. For example, one may have n=2.4 in the high refractive index state and n=1.6 in the low refractive index state. The difference of refraction indices in the two states will typically range from 0.2 to 4. Typical values of refractive indices and extinction coefficients for typical PCMs can for instance be found can be found in "WHP Pernice and H. Bhaskaran, Photonic non-volatile memories using phase change materials, Applied Physics Letters, 101, 011243 2012".

For embodiments relying on thermal switching, the profile of temperatures that need be reached in the PCM for it to switch may typically be in the range of 500-600° C. for GST, or even higher (>600° C.). The switching temperature is material dependent, and not all materials switch at the same temperatures.

Each of the capping layer and the spacer may for instance comprise titanium oxide, zinc oxide or indium tin oxide. The spacer layer 14 is grown to have a thickness that typically is in the range from 10 nm to 250 nm, depending on the colour and optical properties required, and whether such layer need be electrically insulating or not. The capping layer 16 may, for example, be 20 nm thick.

Aluminium or silver may typically be used for the reflector 15. The reflector can may for instance be made from a silver layer (e.g., 30-50 nm thick) or from an aluminium layer (e.g., 20-40 nm thick)

The lateral dimensions of the pixels are not specifically limited (but are typically more than 0.5 nm). The maximal, lateral dimension of the layer structure depends on the type of display contemplated, its resolution, the architecture and materials used.

A minimal degree of transparency is desired for layers 16, 10 and 14. At least 10% transmittance of incident light is typically needed. For the PCM layer, a minimum of 1% is typically needed. Exact values of transmittance depend on the actual thicknesses of the layers. The reflector 15 need, in general, typically be optically thick, except where transmissive backlight is used. In that case, the reflector preferably has a reflectance that is between 70 and 90%, e.g., 80%, on average, over the range of wavelengths of interest. Else, its reflectivity may approach 100%.

The resistive heater element 17 can include, for example, a metal or metal alloy material that exhibits low resistivity and a substantially high thermal conductivity. For example, the resistive heater element can be formed from titanium nitride (TiN), tantalum nitride (TaN), nickel chromium silicon (NiCrSi), nickel chromium (NiCr), tungsten (W), titanium-tungsten (TiW), platinum (Pt), tantalum (Ta), molybdenum (Mo), niobium (Nb), or iridium (Ir), or any of a variety of or a combination of similar metal or metal alloys having the above properties and have a melting temperature that is higher than the melting temperature of the PCM element 10.

The average thickness of the heating element 17 is preferably between 20 nm and 2 µm, and more preferably between 60 nm and 140 nm.

The heater may need be substantially transparent to permit the passage of light through the PCM stack, especially if located between the direct backlight and the reflector, as in FIG. 1. The heater may not contribute to the optical properties of each pixel or it may have an active function in determining the optical transfer function, depending on this application sought.

The barrier layer 18 can be formed of SiN, AlN, $SiO_2$, silicon carbide (SiC), diamond (C) or other barrier material having the required properties. Its thickness will be adapted to achieve the desired electrical insulation level.

If needed, various type of resistively switching elements (or RSEs, see, e.g., element 21 in FIG. 1) may be relied on, which have suitable nonlinear characteristics. For instance, and depending on its location in the device, the RSEs may be designed as threshold switching devices, e.g., as ovonic threshold switches, metal-insulator transition devices, diodes (e.g., thin-film, planar, etc.), or a threshold vacuum switches. Most practical is perhaps to provide it as a mere layer portion. The RSEs 21 of FIG. 1 may for instance comprise an oxide, a nitride, a sulfide, an oxynitride and/or diamond. For example, a RSE may comprise one or more materials that comprise, each, one or more of the following compounds: $NbO_x$, $VO_x$, $HfO_2$, $SiO_2$, $ZrO_2$, and $TiO_2$. Using such materials, the average thickness of the RSE (when provided in the form of a layer or layer portion 21 as in FIG. 1) is preferably between 10 nm and 100 nm, and more preferably between 10 nm and 30 nm.

The substrate 23 (see FIG. 1) onto which pixels are patterned may for example comprise a semiconductor wafer, $SiO_2$, or a flexible substrate such as a polymer film.

3.2 Non-Linear Elements for Passive Matrix Display

As evoked just above, the present display device may further comprise a set of nonlinear, monostable RSEs, which may possibly form part of the pixels, especially if the pixels are thermally switched. The RSEs are, each, in electrical communication with a heating element of one of the pixels. They are designed so as to exhibit a low resistance, unstable state and a high-resistance, stable state. The low resistance state allows the heating element to be energized via the RSE, so as to heat the PCM and reversibly change a refractive index and/or an optical absorption thereof, in operation. The high-resistance state allows leakage currents to be mitigated, so as to prevent inadvertent switching of the PCM from one of its states to the other, in operation. Thus, the display controller may be configured to energize any of the pixels via a respective one of the RSEs, so as to switch the latter from its high-resistance state to its low resistance state, in order to energize a respective heating element and, in turn, reversibly change a refractive index and/or an absorption of a respective PCM.

Thus, RSEs make it possible to filter out parasitic currents or voltage signals, such as "sneak path" currents or leakage currents and the like. This, in turn, prevents inadvertent switching of the PCM elements. This solution is particularly beneficial for passive matrix addressing displays, as discussed below.

3.3. PCM Switching

Signals applied from the display controller 30 may for example cause signals $S_1$, $S_2$ to be generated in output from the RSE element 21 (FIG. 1), which output signals have pulse characteristics (amplitude and duration) that determine the heat profiles subsequently achieved in the heater element 17 and, in turn, the heat transferred to the PCM 10, For example, a signal $S_1$ with first characteristics is provided to the heater while the PCM is in an amorphous state, to set the PCM to a crystalline state. For example, the applied signal $S_1$ causes to generate a first temperature profile $P_1$ in the PCM (from the heating element). In response to the application of the first signal to the heater, the latter generates heat that is conducted to the PCM to induce a temperature $T_1$ greater than the crystallization temperature $T_c$, but less than the melting temperature $T_m$, and which remains greater than $T_c$, for a time sufficient to crystallize the PCM.

Similarly, under application of a suited signal by the controller, a second signal $S_2$ with second characteristics can be generated in output of the RSE, while the PCM is still in a crystalline state. This, in turn, generates a second heat profile $P_2$ in the PCM, which sets the PCM back to an amorphous state. The second heat profile is generated by the resistive heater element 17 in response to the second signal, whereby heat is conducted to the PCM. This results, in the PCM, in a temperature $T_2$ that is now greater than the melting temperature $T_m$ and induces a transition to a liquid phase.

Allowing the temperature to rapidly decay after the falling-edge of the applied pulse results in solidification of PCM in the amorphous state. The heater-temperature profiles $T_1$, $T_2$ generated by the heater may typically have substantially the same shape as the current intensity profiles $S_1$, $S_2$ obtained in out of the RSE.

The pulses applied from the display controller can be adjusted and refined, e.g., by trial and error, and based on all the relevant parameters, starting with the nature of the materials involved and their dimensions. In that respect, materials 21, 17, 18, 15, 14, 10, 16 may be selected and designed (e.g., in terms of thickness) so as to have thermal, optical and/or electrical properties that ensure rapid dissipation of the heat from the PCM 10, e.g., it mitigates the recrystallization of the PCM subsequent to melting (during the amorphisation process).

3.4 Crossbar Structures for Passive Matrix Displays

The present display devices are preferably embodied as passive matrix addressing displays. Such display devices further comprise an arrangement of pairs of electrodes, wherein each of the pairs of electrodes is in electrical communication with a heating element of one of the pixels, via a respective one of the RSEs that is connected in series between the electrodes of each pair, so as for each of the pixels to be individually addressable by the controller in the display device.

For example, the schematic passive matrix display of FIG. 10 involves row 221 and column 222 electrodes in a crosspoint configuration with the pixels 2 located about each crosspoint. For simplicity, pixels 2 are illustrated on each crosspoint in the diagram of FIG. 10. In practice, however, the pixels 2 may need be laterally offset (as illustrated in FIG. 11) from the crosspoints. Still, more sophisticated, 3D structures can be devised, to avoid offset configurations and increase the pixel fill-factor. In the system of FIG. 10, the row electrodes 221 are addressed by a multiplexer 31 and the column electrodes 222 by another multiplexer 32. The multiplexers are controlled by a microprocessor 36 while the timing and signals are handled by a function generator 34. Elements 31-36 can be regarded as forming part of the display controller 30 previously discussed. All electronic interface elements needed are well known per se in the art, e.g., they are standard features of a passive matrix display, which ease the interfacing of a PCM pixel display. Still, the function generator 34 need be fed with or have access to suitable waveform definitions and its timing functions need be adapted to the timing involved in the present sequence of events, taking into account the response times of the RSEs 21, the heating elements 17 and PCMs 10.

In the example of FIG. 1, the RSE 21 is integrated in the pixel, i.e., the RSE is stacked in the layer structure 2 of the pixels. This approach simplifies the fabrication of the device 1 as the RSE merely requires an additional layer deposition when forming the stack. Note that the layer stack 2 sits on the electrodes 221, 222, with the RSE 21 bridging the electrodes, but the layer stack 2 is not sandwiched between the electrodes. In that sense, the electrical path and the thermal/optical paths are de-correlated, which prevent electrodes to interfere with optical properties of the pixels. More generally, the electrical path and the heating path may, in embodiments, be partly de-correlated, since the pixels may be arranged at the level of electrodes underneath, with one or a few layers of the stack bridging the electrodes, while additional layers on top, which are thermally conductive, extend beyond the electrical path, without being sandwiched by the electrodes.

In usual crosspoint device structures, the active element is commonly fabricated at the crossing point, and sandwiched between the row and column electrodes. However, in the present context (a display), one may want to avoid a sandwich configuration and prevent electrodes to interfere with optical properties of the pixels. This can be simply resolved by laterally shifting the pixels. This is illustrated in FIG. 11. Here, each pixel 2 is laterally offset (i.e., in a direction perpendicular to the stacking direction z of the layer structure) from the crosspoint formed at the intersection of electrodes 221, 222. Still, the electrodes 221, 222 are in electrical communication with the RSE (not visible in FIG. 11) of the depicted pixel 2. For example, an edge of the pixel 2 may be parallel and at a distance from one 222 of the electrodes and be contacted by an auxiliary arm 222 *a*, forming a junction with the electrode portion 222. Another, contiguous edge of the same pixel 2 may thus be in direct contact with the other electrode 221.

As a result of positioning the pixel away from the crosspoint, it is necessary to insulate the crossing point of the row and column electrodes, e.g., using a dielectric element or bridge 225. Insulation may, however, already be provided by a layer in which the electrodes are embedded.

For example, the bridge 225 can be fabricated from a polymer material that is first lithographically fabricated over the column electrodes 222 at each crosspoint, e.g., in the form of a disc shape. The polymer disc is then heated past the glass transition temperature such that each disc forms a lenticular shape, which is then cooled. The fabrication of the row electrodes 221 over the column electrodes 222 and the bridge layer 225 then takes place, with the lenticular shape of the bridge 225 guiding the row electrodes 221 over each crosspoint while minimising sharp gradients, which could else lead to increased resistance or failures. In variants, the bridge can be fabricated as an oxide (e.g., $Si_3N_4$), deposited through a mask.

While not allowing the highest density of pixels, the offset configuration of FIG. 11 is quite adequate for many display applications and will typically cover 70% or more of the active area. A black matrix may for instance be used to cover remaining areas (other than pixel areas), including electrodes 221, 22 and dielectric bridges 225.

In variants, more sophisticated structure can be contemplated, which allow larger pixel filling. One key aspect of such variants is to connect electrodes 221, 222 to heating elements of the pixels through transverse vias. Namely, each pair of electrodes can be made in electrical communication with a heating element of a pixel through two transverse vias (not shown), which extend, each, parallel to the stacking direction z of the layer structure.

In the example of FIG. 10, all the pixels 2 in the array can be independently addressed by a sequential application of signals between each combination of row (221) and column (222) electrodes. As evoked in the previous subsection, this may be achieved by applying a row selection signal (e.g., a voltage of a given polarity and magnitude which is itself not sufficient to activate the RSE, that is, smaller than a given threshold voltage $V_0$) to each row electrode. While this signal is in effect for each row, an addressing signal of opposite polarity (with magnitude and duration to either crystallise, re-amorphise or leave unchanged the PCM region at each intersection of the currently active row) is applied to each column electrode simultaneously. The signal of opposite polarity to the row selection signal may then cause the total voltage, in combination with the row selection voltage, across the heater and RSE element of the intended pixels in the row, to exceed Vo and result in the intended current puke. In this manner, each row of the array may be addressed in a given time period, and all rows may be addressed sequentially within the allotted frame time to update the full image on the display.

Such row-wise addressing is a standard method in display driving. Other, more complex passive matrix addressing schemes are also well known, which use orthogonal waveforms applied to the rows as activation signals, allowing multiple rows within the array to be activated at the same time while maintaining independence of the switching signal resulting on each intersection. Such "matrix drive" or "parallel drive" schemes may also be applied to PCM-based displays according to embodiments.

Conversely, rows may be addressed in a non-sequential order, and rows may be addressed more than once in a given frame period, with a portion of the pixels in each row addressed during activating period, so as to spatially separate pixels which are activated simultaneously or during temporally close periods. This may allow more effective heat dissipation from individual pixels and prevent a local build-up of heat from pixels being activated in close spatial and temporal succession, which may interfere with successful re-amorphisation on of the pixels.

More generally, methods for controlling display devices as disclosed herein may notably comprise repeatedly energizing the pixels, via the display controller 30, so as to reversibly switch RSEs 21 in electrical communication with respective heating elements of the pixels and energize the respective heating elements 17. This, as discussed earlier, allows respective PCMB 10 to be reversibly switched.

The devices described above can, in general, be used in the fabrication of displays and (sub)pixels in display devices. The resulting devices can be distributed by the fabricator in raw form (that is, as a single product that has multiple unpackaged devices) or in a packaged form. In any case the device can then be integrated with other devices, discrete circuit elements, and/or other signal processing devices as part of either (a) an intermediate product or (b) an end product. The end product can be any product that includes an optical device such as described above, ranging from low-end applications to advanced products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials or thickness than those explicitly mentioned may be contemplated.

The invention claimed is:

1. A method of operating a transflective display device comprising:
    providing a transflective display device comprising:
        a set of pixels, wherein each of the pixels comprises a portion of bistable, phase change material (hereafter a PCM portion) having at least two reversibly switchable states, in which the PCM portions have two different values of refractive index or optical absorption;
        one or more spacers, optically transmissive, and extending under PCM portions of the set of pixels;
        one or more reflectors, extending under the one or more spacers;
        an energization structure, in thermal or electrical communication with the PCM portions, via the one or more spacers;
        a display controller configured to selectively energize, via the energization structure, PCM portions of the pixels, so as to reversibly switch a state of a PCM portion of any of the pixels from one of its reversibly switchable states to the other;
        a backlight unit, configured in the device to allow illumination of the PCM portions through the one or more spacers; and
        a backlight unit controller, configured for modulating one or more physical properties of light emitted from the backlight unit, wherein:
            the backlight unit is an edge backlight unit, arranged in the device to illuminate the PCM portions from a lateral side of the device, via one or more waveguides, wherein the waveguides extend, each, in a same plane that is parallel to an average plane of the one or more reflectors; and
            the one or more reflectors comprise a reflective layer that extends under the one or more spacers; and
    selectively energizing the pixels, via the display controller, so as to reversibly switch a state of the PCM portion from one of its reversibly switchable states to the other; and
    modulating, via the backlight unit controller, one or more physical properties of light emitted by the backlight unit.

2. The method of operating a transflective display device according to claim 1, wherein:
    the energization structure is a heating structure that is electrically insulated from the PCM portions and in thermal communication therewith, via the one or more spacers;
    the one or more spacers are thermally conducting; and
    the display controller is configured to energize the heating structure to thereby selectively heat PCM portions of the pixels, so as to reversibly switch a state of a PCM portion of any of the pixels from one of its reversibly switchable states to the other.

3. The method of operating a transflective display device according to claim 1, wherein
    the one or more reflectors are configured as a reflective layer extending under the set of pixels.

4. The method of operating a transflective display device according to claim 1, wherein
    the optical structures comprise one or more of: lensed structures, in contact with the reflective layer; holes provided in the reflective layer; microstructures on the reflective layer or in a layer in contact with the reflective layer; and scattering features.

5. The method of operating a transflective display device according to claim 1, wherein
    the device comprises a narrow-band pass filter, the latter including a stack of layers, wherein one or more of the layers of the stack act as the reflective layer, the stack of layers being otherwise designed so as to filter a spectral range of light that exit toward the PCM portions from the waveguide, in operation.

6. The method of operating a transflective display device according to claim 1, wherein
    the device further comprises a wavelength shifter on top of the reflective layer, opposite to the waveguide with respect to the reflective layer.

7. The method of operating a transflective display device according to claim 1, wherein the each of the pixels has a layer structure that includes a distinct, bistable PCM portion layer, the latter including a PCM portion having at least two reversibly switchable states.

8. The method of operating a transflective display device according to claim 7, wherein
the layer structure of each of the pixels includes a capping layer above the PCM portion layer, opposite to the one or more spacers with respect to the PCM portion layer.

9. The method of operating a transflective display device according to claim 8, wherein
the capping layer comprises flat mirrors or lenses configured to direct light emitted from the backlight unit.

10. A method of operating a transflective display device comprising:
providing a transflective display device comprising:
a set of pixels, wherein each of the pixels comprises a portion of bistable, phase change material (hereafter a PCM portion) having at least two reversibly switchable states, in which the PCM portions have two different values of refractive index or optical absorption;
one or more spacers, optically transmissive, and extending under PCM portions of the set of pixels;
one or more reflectors, extending under the one or more spacers;
an energization structure, in thermal or electrical communication with the PCM portions, via the one or more spacers;
a display controller configured to selectively energize, via the energization structure, PCM portions of the pixels, so as to reversibly switch a state of a PCM portion of any of the pixels from one of its reversibly switchable states to the other;
a backlight unit, configured in the device to allow illumination of the PCM portions through the one or more spacers; and
a backlight unit controller, configured for modulating one or more physical properties of light emitted from the backlight unit, wherein:
the backlight unit is an edge backlight unit, arranged in the device to illuminate the PCM portions from a lateral side of the device, via one or more waveguides, wherein the waveguides extend, each, in a same plane that is parallel to an average plane of the one or more reflectors; and
each of the one or more spacers are cladded with cladding layers, so as to form the one or more waveguides for the backlight unit to illuminate the PCM portions via the one or more spacers;
selectively energizing the pixels, via the display controller, so as to reversibly switch a state of the PCM portion from one of its reversibly switchable states to the other; and
modulating, via the backlight unit controller, one or more physical properties of light emitted by the backlight unit.

11. The method of operating a transflective display device according to claim 10, wherein:
the energization structure is a heating structure that is electrically insulated from the PCM portions and in thermal communication therewith, via the one or more spacers;
the one or more spacers are thermally conducting; and
the display controller is configured to energize the heating structure to thereby selectively heat PCM portions of the pixels, so as to reversibly switch a state of a PCM portion of any of the pixels from one of its reversibly switchable states to the other.

12. The method of operating a transflective display device according to claim 10, wherein
the one or more reflectors are configured as a reflective layer extending under the set of pixels.

13. The method of operating a transflective display device according to claim 10, wherein
the optical structures comprise one or more of: lensed structures, in contact with the reflective layer; holes provided in the reflective layer; microstructures on the reflective layer or in a layer in contact with the reflective layer; and scattering features.

14. The method of operating a transflective display device according to claim 10, wherein
the device comprises a narrow-band pass filter, the latter including a stack of layers, wherein one or more of the layers of the stack act as the reflective layer, the stack of layers being otherwise designed so as to filter a spectral range of light that exit toward the PCM portions from the waveguide, in operation.

15. A method of operating a transflective display device comprising:
providing a transflective display device comprising:
a set of pixels, wherein each of the pixels comprises a portion of bistable, phase change material (hereafter a PCM portion) having at least two reversibly switchable states, in which the PCM portion have two different values of refractive index or optical absorption;
one or more spacers, optically transmissive, and extending under PCM portions of the set of pixels;
one or more reflectors, extending under the one or more spacers;
an energization structure, in thermal or electrical communication with the PCM portions, via the one or more spacers;
a display controller configured to selectively energize, via the energization structure, PCM portions of the pixels, so as to reversibly switch a state of a PCM portion of any of the pixels from one of its reversibly switchable states to the other;
a backlight unit, configured in the device to allow illumination of the PCM portions through the one or more spacers; and
a backlight unit controller, configured for modulating one or more physical properties of light emitted from the backlight unit, wherein:
the each of the pixels has a layer structure that includes a distinct, bistable PCM portion layer, the latter including a PCM portion having at least two reversibly switchable states; and
the layer structure of each of the pixels includes a capping layer above the PCM portion layer, opposite to the one or more spacers with respect to the PCM portion, wherein the capping layer comprises reflective optical structures, such as flat mirrors or lenses, configured to reflect light emitted from the backlight unit and out-coupled toward the pixels toward the one or more reflectors,
selectively energizing the pixels, via the display controller, so as to reversibly switch a state of the PCM portion thereof from one of its reversibly switchable states to the other; and
modulating, via the backlight unit controller, one or more physical properties of light emitted by the backlight unit.

16. The method of operating a transflective display device according to claim 15, wherein:
- the energization structure is a heating structure that is electrically insulated from the PCM portions and in thermal communication therewith, via the one or more spacers;
- the one or more spacers are thermally conducting; and
- the display controller is configured to energize the heating structure to thereby selectively heat PCM portions of the pixels, so as to reversibly switch a state of a PCM portion of any of the pixels from one of its reversibly switchable states to the other.

17. The method of operating a transflective display device according to claim 15, wherein
- the one or more reflectors are configured as a reflective layer extending under the set of pixels.

18. The method of operating a transflective display device according to claim 15, wherein
- the optical structures comprise one or more of: lensed structures, in contact with the reflective layer; holes provided in the reflective layer; microstructures on the reflective layer or in a layer in contact with the reflective layer; and scattering features.

19. The method of operating a transflective display device according to claim 15, wherein
- the device comprises a narrow-band pass filter, the latter including a stack of layers, wherein one or more of the layers of the stack act as the reflective layer, the stack of layers being otherwise designed so as to filter a spectral range of light that exit toward the PCM portions from the waveguide, in operation.

* * * * *